US012801192B2

(12) United States Patent
Bidner et al.

(10) Patent No.: US 12,801,192 B2
(45) Date of Patent: Nov. 17, 2026

(54) UNIVERSAL RUGGEDIZED COMPUTER ENCLOSURE WITH FORCED AIR COOLING

(71) Applicant: United States of America as Represented by The Secretary of the Army, Alexandria, VA (US)

(72) Inventors: Nathaniel J. Bidner, Mahomet, IL (US); Joshua D Wattier, Mahomet, IL (US)

(73) Assignee: UNITED STATES OF AMERICA AS REPRESENTED BY THE SECRETARY OF THE ARMY, Alexandria, VA (US)

(*) Notice: Subject to any disclaimer, the term of this patent is extended or adjusted under 35 U.S.C. 154(b) by 17 days.

(21) Appl. No.: 18/479,017

(22) Filed: Sep. 30, 2023

(65) Prior Publication Data

US 2025/0216914 A1 Jul. 3, 2025

Related U.S. Application Data

(63) Continuation-in-part of application No. 17/957,230, filed on Sep. 30, 2022, now Pat. No. 12,402,275.

(51) Int. Cl.

| | |
|---|---|
| ***H05K 7/20*** | (2006.01) |
| ***G06F 1/20*** | (2006.01) |
| ***H05K 9/00*** | (2006.01) |

(52) U.S. Cl.

CPC .......... *G06F 1/20* (2013.01); *H05K 7/20145* (2013.01); *H05K 7/20163* (2013.01); *H05K 7/20172* (2013.01); *H05K 7/20209* (2013.01); *H05K 9/0041* (2013.01); *G06F 2200/201* (2013.01)

(58) Field of Classification Search

CPC .......... H05K 7/20272; H05K 7/20154; H05K 7/2039; H05K 7/20181; H05K 7/20145; H05K 7/20163; H05K 7/20172; H05K 7/20209; H05K 9/0041; G06F 1/181; G06F 1/182; G06F 1/183; G06F 1/20; G06F 2200/1633; G06F 2200/201

USPC .......................................... 361/679.47, 690

See application file for complete search history.

(56) References Cited

U.S. PATENT DOCUMENTS

| | | | | | |
|---|---|---|---|---|---|
| 4,646,202 | A * | 2/1987 | Hook | H05K 11/02 | 361/689 |
| 5,285,347 | A * | 2/1994 | Fox | G06F 1/20 | 257/714 |
| 5,297,005 | A * | 3/1994 | Gourdine | H05K 7/20154 | 361/695 |

(Continued)

*Primary Examiner* — Anatoly Vortman

(74) *Attorney, Agent, or Firm* — Brian C. Jones; Lawrence A. Schemmel

(57) ABSTRACT

In one embodiment, an enclosure device for a printed circuit board (PCB) includes: an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; and one or more fans configured to drive air via one or more inlets from an enclosure exterior outside of the enclosure wall structure through the internal channels and out of the one or more vents. The enclosure wall structure is configured to block air flowing through the internal channels from entering the enclosure interior.

19 Claims, 32 Drawing Sheets

(56) References Cited

U.S. PATENT DOCUMENTS 5,718,628 A * 2/1998 Nakazato ........... H05K 7/20745 236/49.5
5,808,866 A * 9/1998 Porter .................. H05K 7/1424 174/544
6,094,351 A * 7/2000 Kikinis ................ H05K 7/1438 361/728
6,115,252 A * 9/2000 Ohta ....................... G06F 1/203 361/689
6,164,369 A * 12/2000 Stoller ............... H05K 7/20572 165/104.34
6,333,847 B1 * 12/2001 Katsui ..................... G06F 1/203 361/679.55
6,374,627 B1 * 4/2002 Schumacher ............. G06F 1/20 62/263
6,412,292 B2 * 7/2002 Spinazzola ............. G06F 1/206 62/89
6,438,984 B1 * 8/2002 Novotny ............ H05K 7/20172 257/E23.098
6,494,050 B2 * 12/2002 Spinazzola ........ H05K 7/20745 62/89
6,574,104 B2 * 6/2003 Patel .................. H05K 7/20745 62/263
6,854,284 B2 * 2/2005 Bash .................. H05K 7/20836 236/49.3
6,967,842 B2 * 11/2005 Aoki .................. H05K 7/20772 165/80.4
7,012,807 B2 * 3/2006 Chu .......................... G06F 1/20 165/80.4
7,170,745 B2 * 1/2007 Bash ....................... G06F 1/206 361/695
7,203,063 B2 * 4/2007 Bash .................. H05K 7/20772 174/15.1
7,212,403 B2 * 5/2007 Rockenfell ............... G06F 1/20 361/679.52
7,405,930 B2 * 7/2008 Hongo .................... G06F 1/203 361/679.48
7,466,548 B2 * 12/2008 Ishikawa ............. H01L 23/4006 174/15.1
7,471,513 B2 * 12/2008 Hayashi .................... G06F 1/20 361/695
7,675,748 B2 * 3/2010 Matsushima ...... G11B 33/1426 361/699
7,813,121 B2 * 10/2010 Bisson ............... H05K 7/20736 361/679.53
7,878,889 B2 * 2/2011 Day ................... H05K 7/20745 454/184
7,898,805 B2 * 3/2011 MacDonald ............ G06F 1/203 361/679.48
8,184,436 B2 * 5/2012 Campbell .............. H05K 7/203 361/701
8,248,793 B2 * 8/2012 Bash .................. H05K 7/20781 361/679.48
8,713,956 B2 * 5/2014 Couto ................... G06F 1/1632 165/80.2
8,902,581 B2 * 12/2014 Goto ....................... G06F 1/203 257/722
8,959,941 B2 * 2/2015 Campbell .......... H05K 7/20781 361/679.52
10,371,456 B2 * 8/2019 Stark ........................ F28F 13/08
10,416,736 B2 * 9/2019 Dupont .............. H05K 7/20936
11,687,133 B2 * 6/2023 Kulkarni ............ H05K 7/20145 361/679.46
2003/0042004 A1 * 3/2003 Novotny ............ H05K 7/20172 257/E23.098
2003/0067745 A1 * 4/2003 Patel .................. H05K 7/20745 361/690
2004/0250992 A1 * 12/2004 Aoki .................. H05K 7/20727 165/80.4
2005/0217828 A1 * 10/2005 Tomioka ................. G06F 1/203 165/104.31
2005/0243518 A1 * 11/2005 Hata ....................... G06F 1/203 257/E23.098
2006/0162901 A1 * 7/2006 Aizono ................. H01L 23/473 257/E23.098
2007/0091567 A1 * 4/2007 Hayashi .................... G06F 1/20 361/695
2008/0101017 A1 * 5/2008 Hata .......................... G06F 1/20 361/690
2013/0271905 A1 * 10/2013 Sullivan ................ G06F 1/1607 361/679.02

* cited by examiner

UNIVERSAL RUGGEDIZED COMPUTER ENCLOSURE WITH FORCED AIR COOLING

STATEMENT OF GOVERNMENT INTEREST

Under paragraph 1 (a) of Executive Order 10096, the conditions under which this invention was made entitle the Government of the United States, as represented by the Secretary of the Army, to an undivided interest therein on any patent granted thereon by the United States. This and related patents are available for licensing to qualified licensees.

BACKGROUND

Field of the Invention

The present invention relates to enclosures for computers and, more specifically, universal ruggedized enclosures for portable computers with cooling including, for example, forced air cooling.

Description of the Related Art

This section introduces aspects that may help facilitate a better understanding of the invention. Accordingly, the statements of this section are to be read in this light and are not to be understood as admissions about what is prior art or what is not prior art.

Enclosures have been used for receiving and supporting motherboards including, for example, ATX (Advanced Technology extended) and NLX (New Low-profile eXtended) motherboards. One example is disclosed in U.S. Pat. No. 6,094,351 for UNIVERSAL ENCLOSURE FOR DIFFERENT TYPE MOTHER BOARDS, which is incorporated herein by reference in its entirety.

In unmanned ground vehicle robotics research, for instance, an onboard computer needs to meet requirements for both performance and ruggedization in a variety of applications including, for instance, unmanned ground vehicle robotics. A main problem is that the highest performance computers which can handle heavy software development are meant to sit idle in a desktop environment. COTS ruggedized computers do not meet hardware compute performance requirements for heavy software development, especially with constantly evolving technology in both the hardware and software space. In addition, such rugged computers are often very cost ineffective, do not include the newest hardware available, and are effectively a black box which cannot be upgraded or modified to meet changing hardware requirements.

A sealed pelican case is available to ruggedize a desktop style computer. One disadvantage is that the form factor is quite large compared to a purpose-built ruggedized computer. In addition, pelican cases are often sealed from the environment such that while one can water cool some components of the computer, the motherboard still relies on ambient air movement for cooling. In such a case, the air circulating will become increasingly warmer. There are some existing solutions which utilize an air conditioning unit or Peltier device for cooling the air inside the case. One drawback here is that the A/C unit requires a lot of space and power and is expensive, the Peltier devices used in some cases require a lot of power because they are trying to cool an unnecessarily large space, and the air will not be conditioned to remove moisture which can kill a motherboard in extreme scenarios. With both of these existing solutions, passive water cooling is still needed on several components of the computer. The other drawback of this pelican case is that there is usually very limited shock dampening, so in the case where it is mounted onboard a ground platform which may experience very uneven terrain the components inside of the computer will eventually loosen or break resulting in failure as they were not assembled to see this kind of shock and vibration. Another drawback in integrating a desktop computer on a ground platform is that a large inverter is required to power the computer which already has a built in power supply. The inverter takes valuable space and power delivery is inefficient as it is likely converted from DC to AC back to DC and additional noise is added to the system. In sum, COTS ruggedized computers often do not have enough compute power, are expensive, are not modular to expansion or updates, and often utilize custom motherboards which lead to difficulty in software development. Existing methods to ruggedize existing desktop style computers is space inefficient, power inefficient, and are not known to be able to withstand severely rugged or harsh environments and operation.

SUMMARY

The present invention was developed to improve the performance and functionality of an enclosure for housing a PCB (Printed Circuit Board) of a computer. A novel universal ruggedized system enclosure can be used to integrate a high performance non-ruggedized computer and expansion accessories in a rugged environment. One unique problem is that computer components can be outdated within a year or two of being released. A ruggedized computer built with specific components may become "old technology" by the time it is actually out for production in the field. While there are COTS ruggedized computers, they cannot be fitted with new motherboards or PCIe (Peripheral Component Interconnect Express) expansion cards. Although one may be able to swap the CPU or GPU, such CPU or GPU may have higher requirements for cooling in situations where one cannot actually utilize them in the existing infrastructure.

Research and development have led to a novel compact, sealed, ruggedized computer or equipment enclosure with the purpose of cooling high thermal output devices while protecting from environmental variables including temperature, shock and vibration, humidity, dust, and water. This is done using forced air cooling with fans being the only moving part. An onboard computer meets requirements for both performance and ruggedization in a variety of applications including, for instance, unmanned ground vehicle robotics. The universal ruggedized system enclosure is used to integrate a high performance non-ruggedized computer and expansion accessories in a rugged environment.

Embodiments of the present invention provide a universal ruggedized PCB system enclosure as a solution to ruggedizing a common COTS desktop computer in a compact, easily integrated format. It is composed of a number of components including but not limited to a plurality of enclosure wall structure sections which are assembled together to enclose and seal the enclosure interior. The enclosure wall structure sections include multiple monolithic heat exchanger sections each including therein an internal geometry of a monolithic heat exchanger section core having a plurality of internal channels forming a complex lattice structure. Heat pipes are disposed adjacent to or in contact with the monolithic heat exchanger sections to transfer heat to the complex lattice structure where heat is then radiated and channeled out of the system using forced air.

The system enclosure may be a universal ruggedized ATX system enclosure. It is a self-contained compact computer enclosure that is universal to housing any ATX style motherboard. The system is sealed from the environment while still providing the necessary features to properly cool and protect the computer and peripherals needed.

An aspect of the present invention is directed to an enclosure device for a printed circuit board (PCB). The enclosure device comprises: an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; and one or more fans configured to drive air via one or more inlets from an enclosure exterior outside of the enclosure wall structure through the internal channels and out of the one or more vents. The enclosure wall structure is configured to block air flowing through the internal channels from entering the enclosure interior.

In accordance with another aspect, an enclosure device for a printed circuit board (PCB) comprises: an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; one or more fans configured to drive air via one or more inlets from an enclosure exterior outside of the enclosure wall structure through the internal channels and out of the one or more vents; and a first closed system of one or more first heat pipes including a first working fluid flowing therein, the one or more first heat pipes being disposed adjacent to or in contact with a portion of the monolithic heat exchanger.

In accordance with another aspect, an enclosure device for a printed circuit board (PCB) comprises: an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; and one or more fans configured to drive air via one or more inlets from an enclosure exterior outside of the enclosure wall structure through the internal channels and out of the one or more vents. The monolithic heat exchanger including a turbulent core portion configured to produce cross flow between the internal channels to promote turbulent airflow through the turbulent core portion.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1:
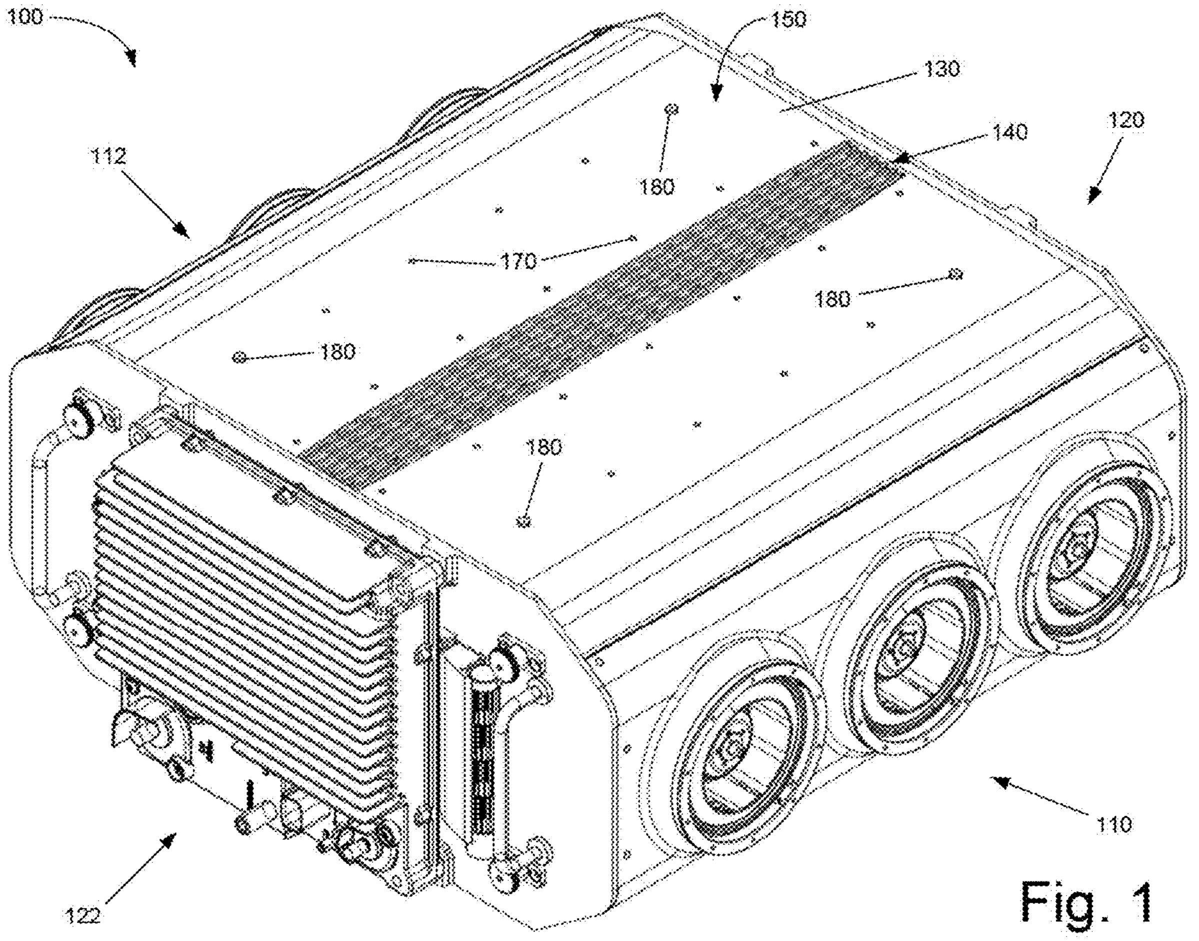
FIG. 1 is an upper perspective view of an enclosure for a computer system including a printed circuit board (PCB) such as a motherboard according to an embodiment of the present invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The system enclosure is sealed from the external environment which is very difficult to accomplish in high performance computing without water cooling. To address the problem, the entire system enclosure is a functioning air to air heat exchanger. Generative design has been used to create a complex lattice structure within the enclosure wall structure forming pathways for the air to flow. Keeping the environment within the internal volume sealed, heat is transferred to the structure of the case where it is processed and removed from the overall system. This is done within the walls, which contain a network of heat pipes that fan out like veins throughout the structure. This network carries heat through a complex lattice structure where heat is then radiated and channeled out of the system using forced air. This design technique maximizes surface area by volume while also allowing a controlled introduction of turbulent air.

Additive manufacturing or 3D printing has transformed the ways in which heat exchangers can be fabricated. It makes possible complex and freeform designs that are difficult to achieve using conventional techniques. It is possible to create a compact, light-weight heat exchanger with complex internal channels. The heat exchanger is formed in the enclosure wall structure of the enclosure. The enclosure wall structure includes therein an internal geometry of an additive manufactured heat exchanger core in a monolithic heat exchanger having a lattice structure. The monolithic heat exchanger includes a turbulent core portion configured to produce cross flow between the internal channels to promote turbulent airflow through the turbulent core portion. The monolithic heat exchanger may further include a directional core portion configured to limit or block cross flow between the internal channels to impede turbulent airflow and promote laminar airflow through the directional core portion.

If the enclosure wall structure is constructed by combining a plurality of enclosure walls, each enclosure wall has an internal geometry of a monolithic or single-piece, additive manufactured heat exchanger component core of a monolithic heat exchanger component having a corresponding component lattice structure providing internal channels of the heat exchanger component core. When the enclosure walls are coupled together, the internal channels of the plurality of heat exchanger component cores of the enclosure walls are connected to form an overall system lattice structure of the entire system enclosure. Part of the lattice may be derived from a bone barrow like structure that is optimized for integration into the heat exchanger system of the enclosure. In addition, portions of the lattice in proximity to concentrated thermal energy where maximum heat transfer is to occur benefit from turbulent airflow. The internal channels are configured to produce turbulent airflow so that when the air reaches the critical heat exchange areas, the lattice structures can increase heat exchange capacity in the critical heat exchange areas. Turbulence may be increased by using rough surfaces in the channels. Heat exchange of the lattice may be increased by increasing surface area, selecting appropriate materials, using turbulence promoters to generate alterations in flow paths, and employing heat pipes. On the other hand, parts of the lattice may be directional in part to ensure the air enters and exits in the intended locations within the enclosure. There is limited cross flow between the chambers to minimize or avoid the introduction of turbulent airflow and produce a substantial laminar airflow.

In specific embodiments, the internal geometry of an additive manufactured heat exchanger core in the enclosure wall structure may include a plurality of flow passages, at least one flow passage of which is varied with respect to a distance along the length of the at least one flow passage. The core has portions that are arcuate. Within the enclosure wall structure, the core has core faces for airflow to exit or enter the core. The internal channels of the core may be configured to direct the airflow that is perpendicular to the core faces. Alternatively, the airflow entering or exiting the core faces may be non-perpendicular.

The system enclosure may also be equipped with a network of tubing manufactured into the structure. This network of tubing transports actively cooled liquid gallium which can be used when the threshold of the thermal operating enveloped is neared. Additionally, a shorter less complex network of tubing carries pressurized water to external misters manufactured into the structure. This system is used when surpassing the thermal operating envelope is eminent, water is projected onto the outside surface of the system in a fine and uniform mist, evaporative cooling occurs temporarily extending the thermal operating envelope allowing for safe recovery and or safe controlled shutdown of the contained equipment.

The system is configured to monitor internal and external environmental conditions via a network of integrated sensors. These sensors can monitor system 3D orientation, vibration and acceleration, magnetic heading, internal and external air containment level, temperature, humidity, and EMI. This network of sensors connects back to an environmental control unit which outputs controls to the various subsystems and subassemblies that make up the system enclosure. In addition, the enclosure may be mounted on additional suspension mechanisms such as fastener mount compression springs. Brackets for those suspension mechanisms may be mounted to holes provided in the enclosure wall structures.

Embodiments of the present invention provide a universal PCB system enclosure that does not require water cooling. A specific embodiment of the system enclosure is a universal ruggedized ATX system enclosure. It is a self-contained compact computer enclosure that is universal to housing any ATX style motherboard. The system is sealed from the environment while still providing the necessary features to properly cool and protect the computer and peripherals needed.

The system enclosure allows the use of any ATX or Extended ATX (E-ATX) motherboard single or dual socket in a rugged environment without modification. The same applies to adding dual video cards and utilizing any CPU available in this system up to (50) degree Celsius ambient. The system enclosure provides a standalone solution that does not require any additional infrastructure such as external radiators, pumps, freon chillers, or air conditioners, etc. The entire volume of this system is an active heat exchanger, not wasting any space. This facilitates significantly reducing the form factor of the system.

The enclosure's unique and novel structural design combined with its approach to cooling allows for system to be far more compact than any known ruggedized form factors currently on the market. The heat exchanger effectively acts as the structure and function of the system, unlike most enclosures where a base frame/case utilizes "bolt-on" heat exchangers. A custom CPU block transfers heat from the CPU directly to the outside of the enclosure via heat pipes. Typically, a CPU block utilizes heat pipes for the same reason but dissipates the heat inside of the enclosure.

Computer Enclosure Exterior

FIG. 1 is an upper perspective view of an enclosure 100 or system enclosure 100 for a computer system including a printed circuit board (PCB) such as a motherboard according to an embodiment of the present invention. The enclosure 100 has a first side 110 and a second side 112, which may be symmetric lateral side segments. Disposed on opposite sides of the enclosure 100, these lateral side segments 110, 112 act as semi-permanent structures of the enclosure 100 and serve multiple purposes. First, they act as a first mounting structure in the system to which the component shelves are secured (see, e.g., FIGS. 23-26). The enclosure 100 includes a first end cap or anterior end cap 120 and a second end cap or posterior end cap 122. The end caps 120, 122 each act as a semi-permanent structure of the enclosure 100 and are assembled to the first side 110 and second side 112. A first hatch or top hatch 130 is a removable structure or hatch of the enclosure 100. A top vent 140 runs the length of the top hatch 130 from the anterior end cap 120 to the posterior end cap 122. The vent 140 is an opening or cutout of an outer wall or skin 150 of the top hatch 130, exposing a portion of a lattice structure of the top hatch 130.

The top hatch 130 has a plurality of holes 170 (e.g., 26 holes) which are used for a number of purposes. Optionally, some of the holes 170 receive water mister inserts 180 to integrate a network of misters. These misters act as part of an emergency thermal response system that can be equipped when the system enclosure 100 is mounted externally to a vehicle (e.g., in the case of construction equipment). The mist generators allow for the enclosure's external heat exchanger working surfaces to be uniformly coated in a fine layer of water, and evaporative cooling occurs temporarily allowing for an extended thermal operating envelope. In an alternative embodiment, the system enclosure 100 has a network of tubes external of the protected volume that allows for pressurized water to be delivered to an array of fine misters. This alternative cooling system would be used when extreme environmental conditions or factors lead to thermal runaway, allowing the event to be stalled and enabling a controlled and safe recovery or shutdown of the computer system.

Figure 2:
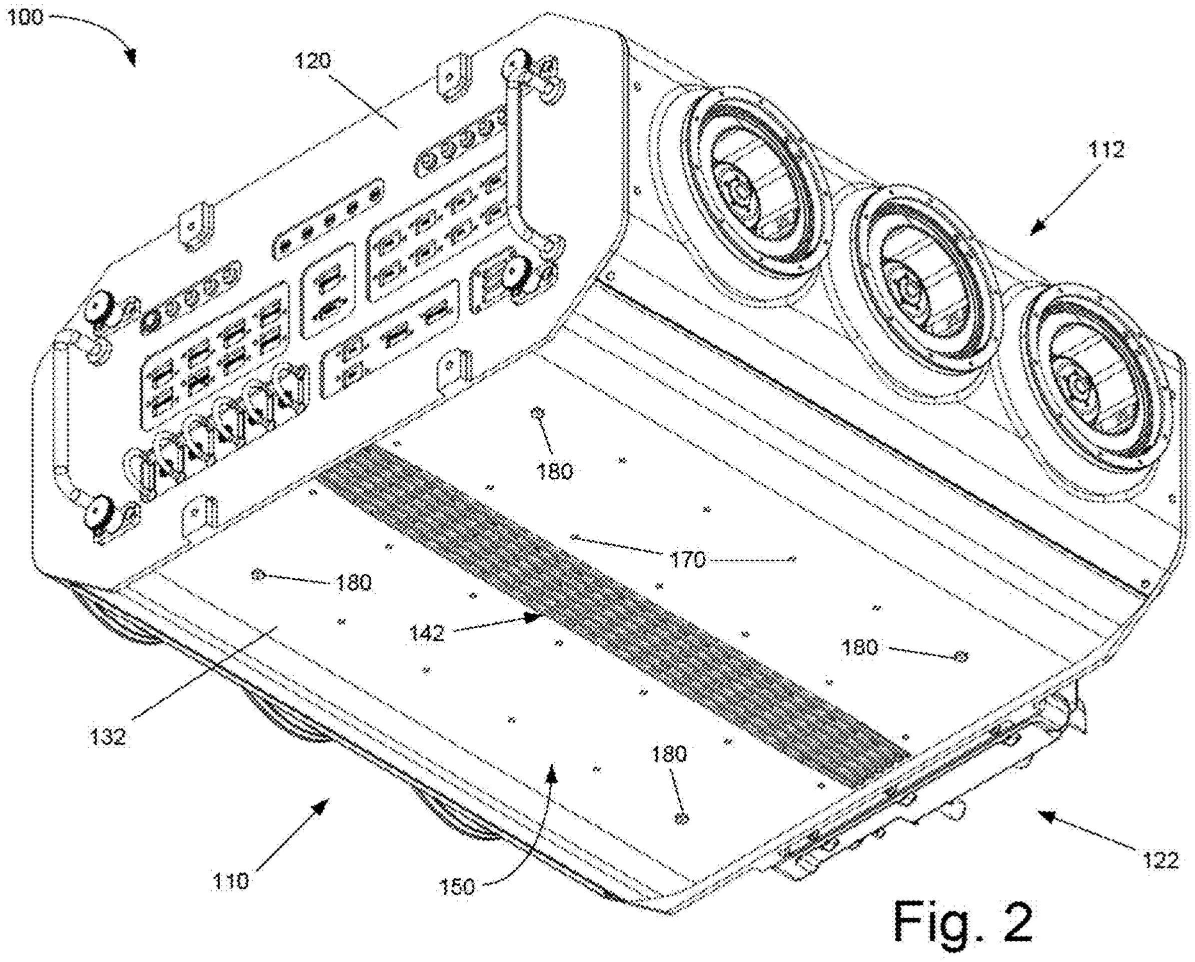
FIG. 2 is a lower perspective view of the enclosure of FIG. 1.

FIG. 2 is a lower perspective view of the enclosure 100 of FIG. 1. A bottom hatch 132 is structurally similar to the top hatch 130 and serves a similar function as the top hatch 130. The bottom hatch 132 also has a plurality of holes 170 (e.g., 26 holes), four of which receive water mister inserts 180 to integrate a network of misters. The exterior parts (first side 110, second side 112, anterior end cap 120, posterior end cap 122, top hatch 130, bottom hatch 132) serve multiple purposes. One purpose is to be joined or attached together to seal the enclosure 100 to form a sealed system from the external environment while providing structural integrity to the enclosure 100. The anterior end cap 120 and the posterior end cap 122 may serve different functions in addition to sealing the enclosure 100 and providing structural integrity to the enclosure 100, as described below.

The system enclosure 100 includes a system lattice including lattice structures manufactured inside the walls of at least four parts configured for ease of assembly and accessibility. In the embodiment shown, those lattice structures are manufactured in the first side 110, second side 112, top hatch 130, and bottom hatch 132. It is crucial that the system be sealed where the inside air is separate from the outside air. The enclosure wall structure is configured to block the air flowing through the internal channels from entering the sealed enclosure interior. To accomplish this, double mechanical seals (FIGS. 7-9 and FIGS. 13-19) have been implemented in the design to allow for secure assembly and ingress protection. These seals are very important to prevent dust, water, or other unwanted contaminants from entering the system. The inside air needs to be a controlled separately so that it can be regulated to reduce humidity. Additionally, the air flowing from one part to the next through the system lattice acts as another form of ingress protection. For example, if dust were to make it past the first mechanical seal on the outside, it would then have to pass through rushing air before reaching the second mechanical seal.

The system enclosure 100 includes a hybrid tubular lattice structure that is different from a standard homogenous strut lattice. The hybrid tubular lattice structure includes one or more turbulent core portions in which the internal channels are interconnected and shaped to produce cross flow between the internal channels and promote turbulent airflow and one or more directional core portions in which the internal channels are directional to limit or block cross flow between the internal channels and impede turbulent airflow. In embodiments, the lattice is initially derived from a bone barrow like structure that is optimized for integration into the heat exchanger system of the enclosure 100. The lattice bends to channel laminar airflow into areas of interest while also introducing turbulent airflow by modifying the lattice in certain regions to optimize turbulent airflow without creating too much back pressure in the system. This turbulent airflow is crucial to the operation of the system because it forces the thermal energy inside to slow down and the lattice then has a chance to dissipate thermal energy before being reintroduced into the system. Turbulent air flow attributable to the internal lattice structure and shape of the system components accelerates thermal dissipation. The lattice acts as an air-to-air heat exchanger while also creating a rigid, lightweight structure that serves as a functioning enclosure. This is important because it optimizes space and treats every cubic millimeter as part of the heat exchanger. In summary the system lattice is a dual-purpose heat exchanger and structure.

In embodiments, the enclosure wall structure includes a plurality of enclosure wall structure sections (e.g., the anterior end cap 120, posterior end cap 122, first side 110, second side 112, top hatch 130, and bottom hatch 132) which are assembled together to enclose and seal the enclosure interior and which include a plurality of separate heat exchanger wall structure sections (e.g., the first side 110, second side 112, top hatch 130, and bottom hatch 132). Each heat exchanger wall structure section includes therein a separate internal geometry of a separate monolithic heat exchanger section having a separate plurality of internal channels, the separate heat exchanger wall structure sections configured to be combined to form a system heat exchanger of a system heat exchanger core having a plurality of system internal channels through which the air driven by the one or more fans flows from the one or more inlets to the one or more vents. The heat exchanger sections may be made using any suitable 3D printing or metal additive manufacturing techniques. Each separate monolithic heat exchanger section may comprise a direct metal laser sintered (DMLS) body by 3D printing, or a Powder Bed Fusion or Directed Energy Deposition manufactured body formed by Selective Laser Melting (SLM) printing, to include a tubular lattice structure with the internal channels. The plurality of enclosure wall structure sections may be connected to each other via double mechanical seals. Each double mechanical seal includes an exterior mechanical seal and an interior mechanical seal. The interior mechanical seal may comprise a protruding lip (e.g., FIG. 4 and FIG. 7) or a flange (e.g., FIGS. 13-19) protruding from one enclosure wall structure section to make contact with one or more other enclosure wall structure sections.

The system enclosure 100 provides excellent EMI shielding without adding additional COTS EMI shielding mesh. This is because not only is aluminum a good material for EMI shielding but also the complex system lattice structure forming pathways for air to flow also acts as another layer of shielding due to its complex geometric nature, which scatters electromagnetic radiation. As such, the monolithic heat exchanger in the enclosure wall structure comprises an aluminum monolithic heat exchanger core having the internal channels configured geometrically to scatter electromagnetic radiation and provide EMI shielding.

With the system being sealed from the outside it is critical that the thermal energy be dispersed throughout the system and reach as much of the lattice structure as possible. This can be done with a network of heat pipes that are nestled into dimples of the heat exchanger to maximize surface area that is surrounded by turbulent airflow. The heat pipes may fan out like veins throughout the structure to transfer heat to the complex lattice structure where heat is then radiated and channeled out of the system using forced air (e.g., generated by fans 1510 in FIG. 15). These heat pipes may run laterally and longitudinally to the enclosure to make sure that high density areas of thermal energy are distributed throughout the system, taking advantage of the significant surface area of the lattice and thermally conductive enclosure. Examples of the heat pipes include those shown in FIGS. 21, 22, 25, and 27-31 and described below.

Posterior End Cap—Power Converter with Environmental Control Unit (ECU)

Figure 3:
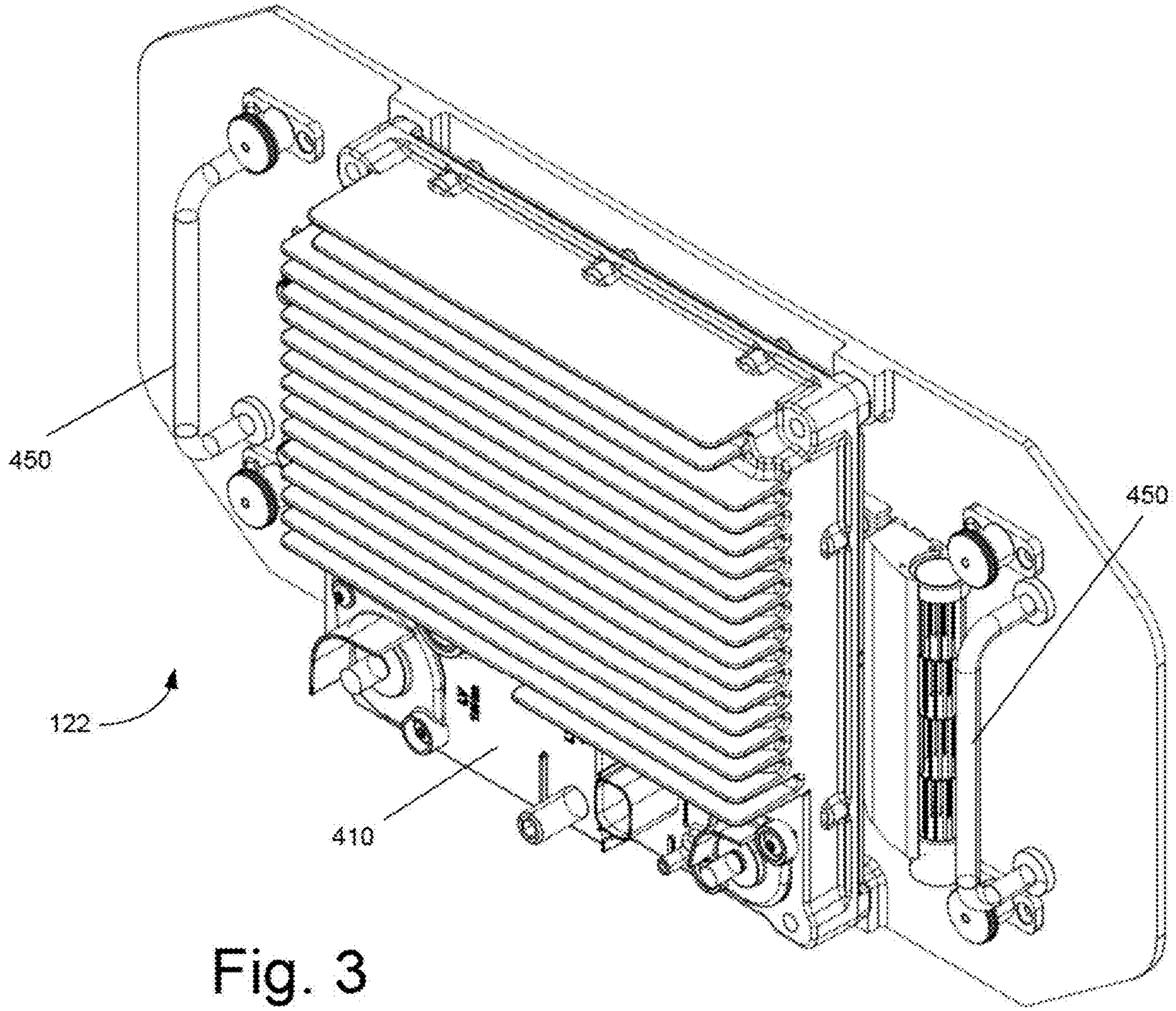
FIG. 3 shows an exterior perspective view of an example of a posterior end cap of the enclosure.
Figure 4:
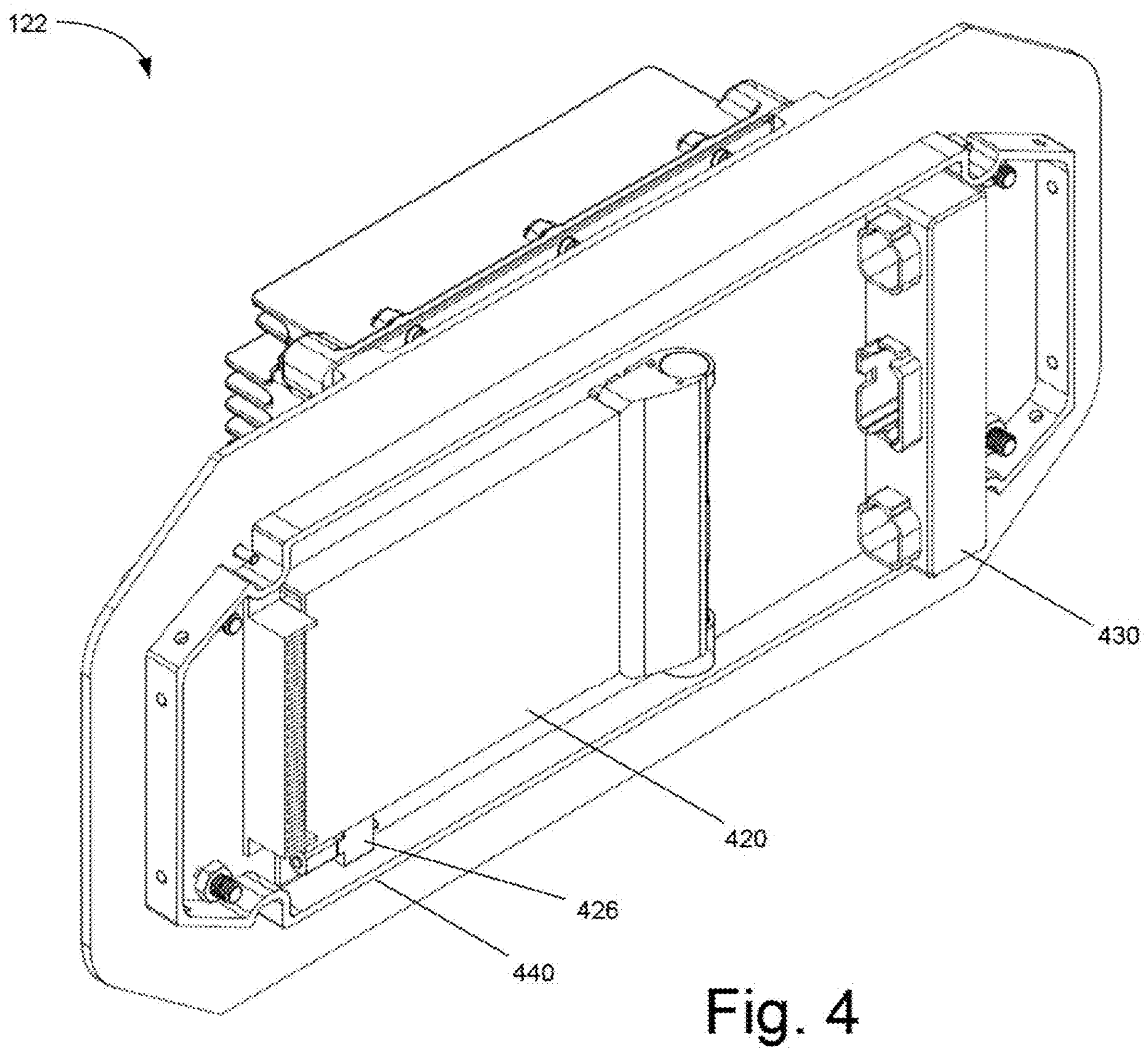
FIG. 4 shows an interior perspective view of the posterior end cap of FIG. 3.

FIG. 3 shows an exterior perspective view of an example of a posterior end cap 122 of the enclosure 100. FIG. 4 shows an interior perspective view of the posterior end cap 122 of FIG. 3. In the exterior view of an isolated subassembly of the posterior end cap 122, a sealed power converter 410 is configured to accept a range of power input for system use. The interior view shows an environmental control unit (ECU) subassembly 420, a pump 426, and a sealed pass-through power distribution block 430. The purpose of the ECU 420 is to circulate air and remove moisture contained inside the sealed enclosure 100. The purpose of the power distribution block 430 is to take power from the output of the power converter 410 and break it out into many points within the system. A protruding lip 440 travels around the posterior end cap 120 to create a seal with the first side 110, second side 112, top hatch 130, and bottom hatch 132. Lastly, there are two grab handles 450 for transportation.

Figure 5:
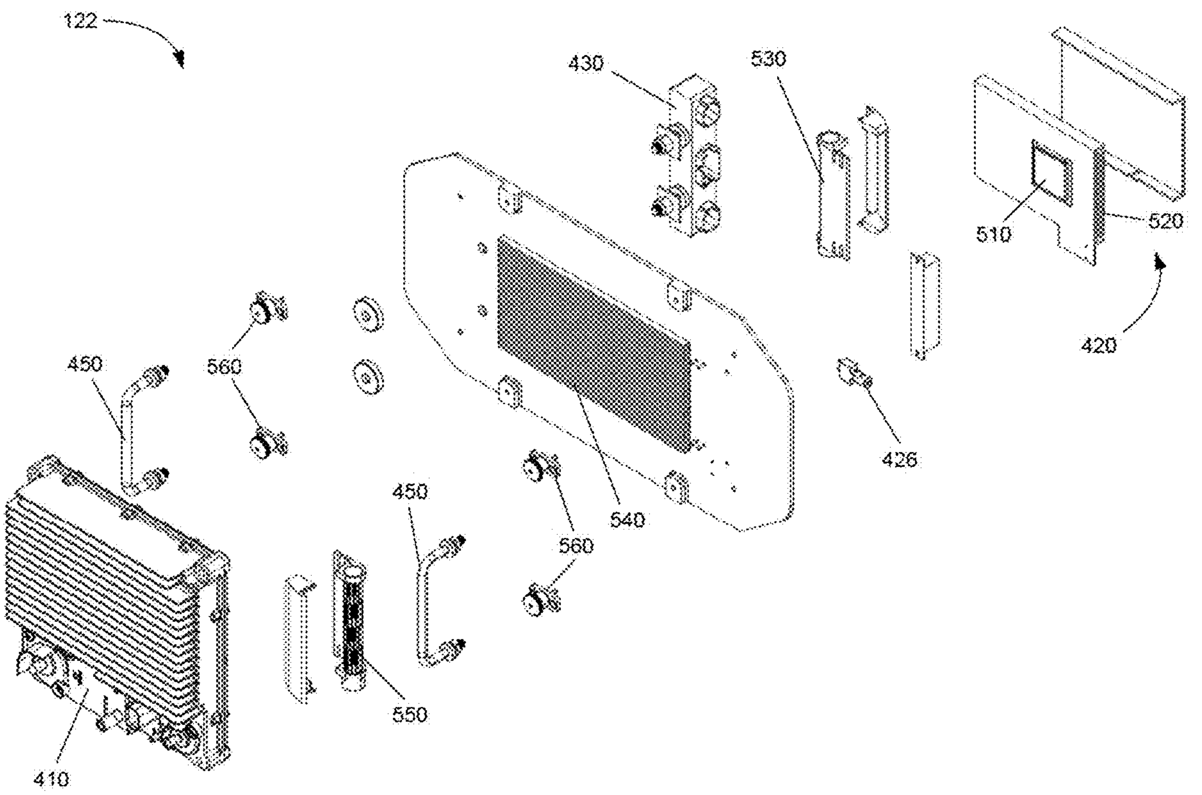
FIG. 5 is an exploded perspective view of an isolated subassembly of the posterior end cap of FIG. 3.

FIG. 5 is an exploded perspective view of an isolated subassembly of the posterior end cap 122 of FIG. 3. With the ECU 420 removed from the posterior end cap 122, a Peltier device 510 is revealed. The cold side on the interior is mated to a heat sink 520 where a cross flow fan 530 circulates contained air, effectively condensing the water vapor so it can be removed from the system with the pump 426. With the power converter 410 removed there is a visible raised heat sink 540 nestled between the converter mounting points. This heat sink 540 mates with the hot side of the Peltier device 510, using an exterior cross flow fan 550 to effectively pull the energy produced by the Peltier device 510 outside of the system. Also shown are four plungers 560, one on each corner, which are used to secure the top hatch 130 and bottom hatch 132 to the posterior end cap 122 to seal the system enclosure 100.

Anterior End Cap—Control Panel

Figure 6:
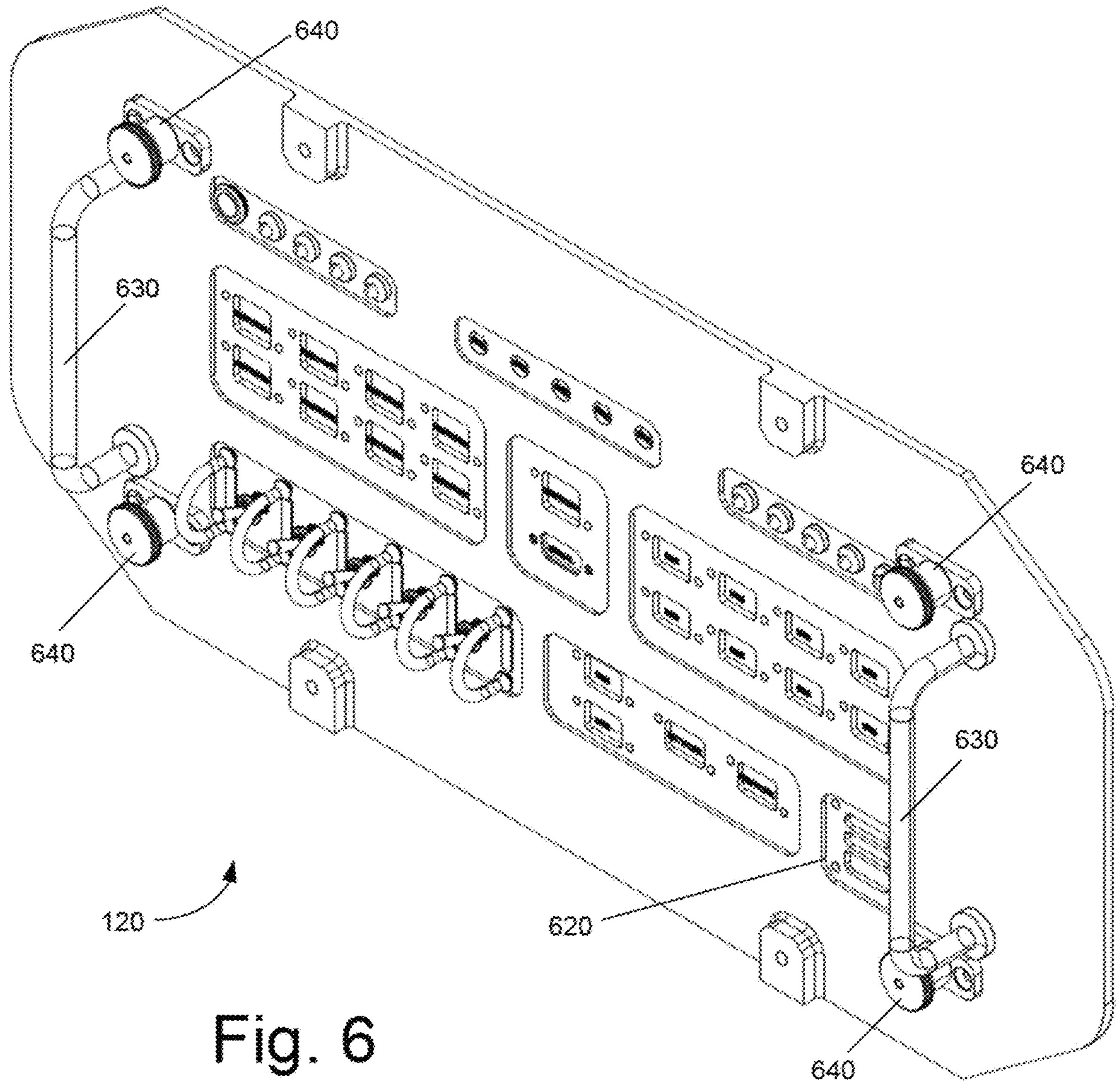
FIG. 6 is an exterior perspective view of an example of an anterior end cap of the enclosure.

FIG. 6 is an exterior perspective view of an example of an anterior end cap 120 of the enclosure 100. The isolated subassembly of the anterior end cap 120 functions as a control panel for the system. The part can be modified to act as a sealed interface panel for whatever may be housed inside of the system, but in this case, it is set up to interface with a computer and all other standard components that would ordinarily be installed in the system. This configuration includes cable interfaces for Ethernet, USB, HDMI, display port, serial port, antennas, switches, and indicator lights. Shown in the bottom right corner is a reservoir/level indicator 620 for the moisture removed from the system. Also illustrated are identical features to those of the posterior end cap 122, including two grab handles 630 and four plungers 640.

Figure 7:
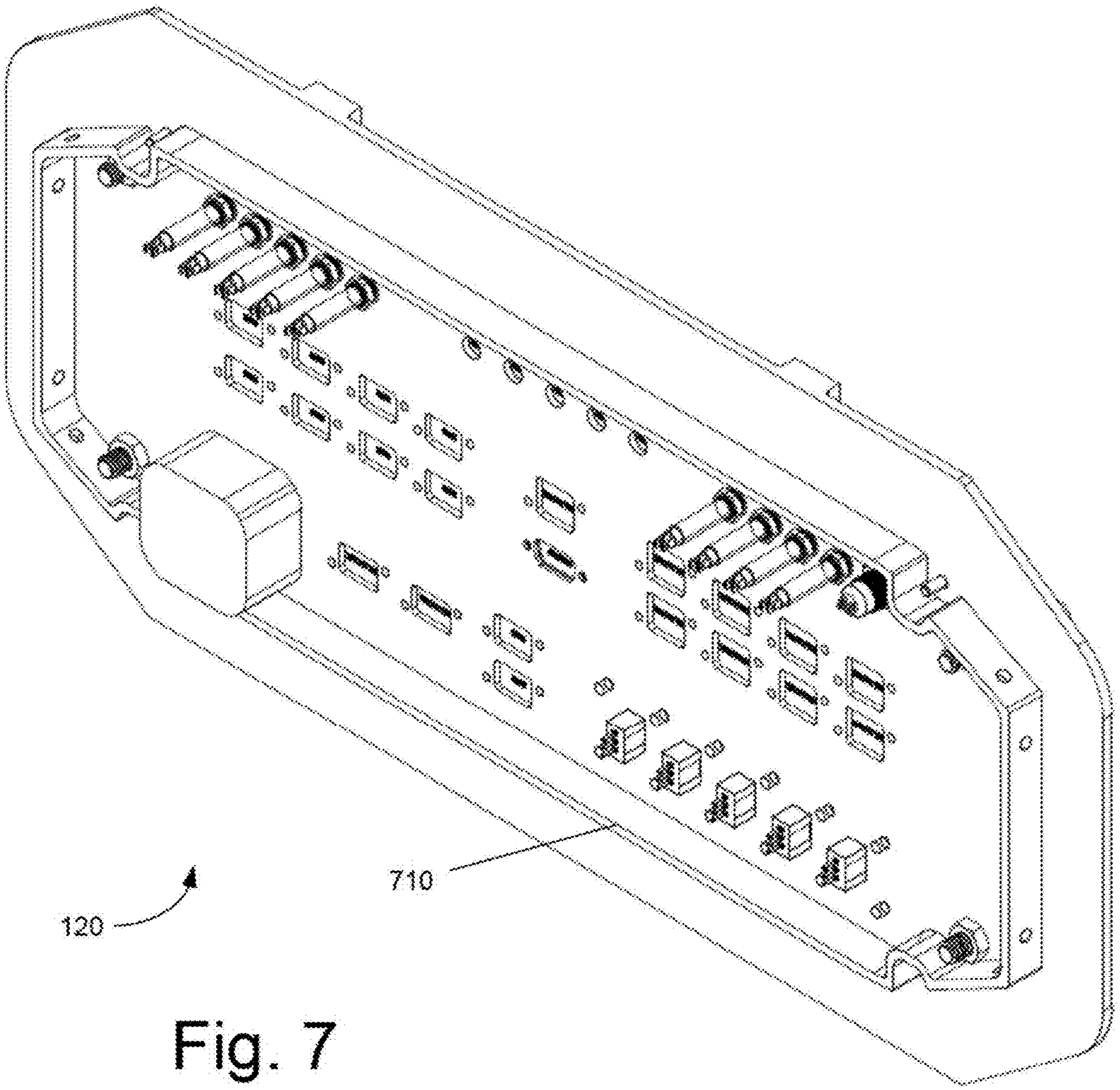
FIG. 7 is an interior perspective view of the anterior end cap of FIG. 6.

FIG. 7 is an interior perspective view of the anterior end cap 120 of FIG. 6. A protruding lip 710 travels around the anterior end cap 120 to create a seal with the first side 110, second side 112, top hatch 130, and bottom hatch 132. The protruding lip 710 of the anterior end cap 120 and the protruding lip 440 of the posterior end cap 122 form a double mechanical seal in the larger assembly of the enclosure 100. The double mechanical seal allows for secure assembly and ingress protection. This seal is very important to prevent dust, water, or other unwanted contaminants from entering the system. The inside air needs to be a controlled separate body so that it can be regulated to reduce humidity.

Figure 8:
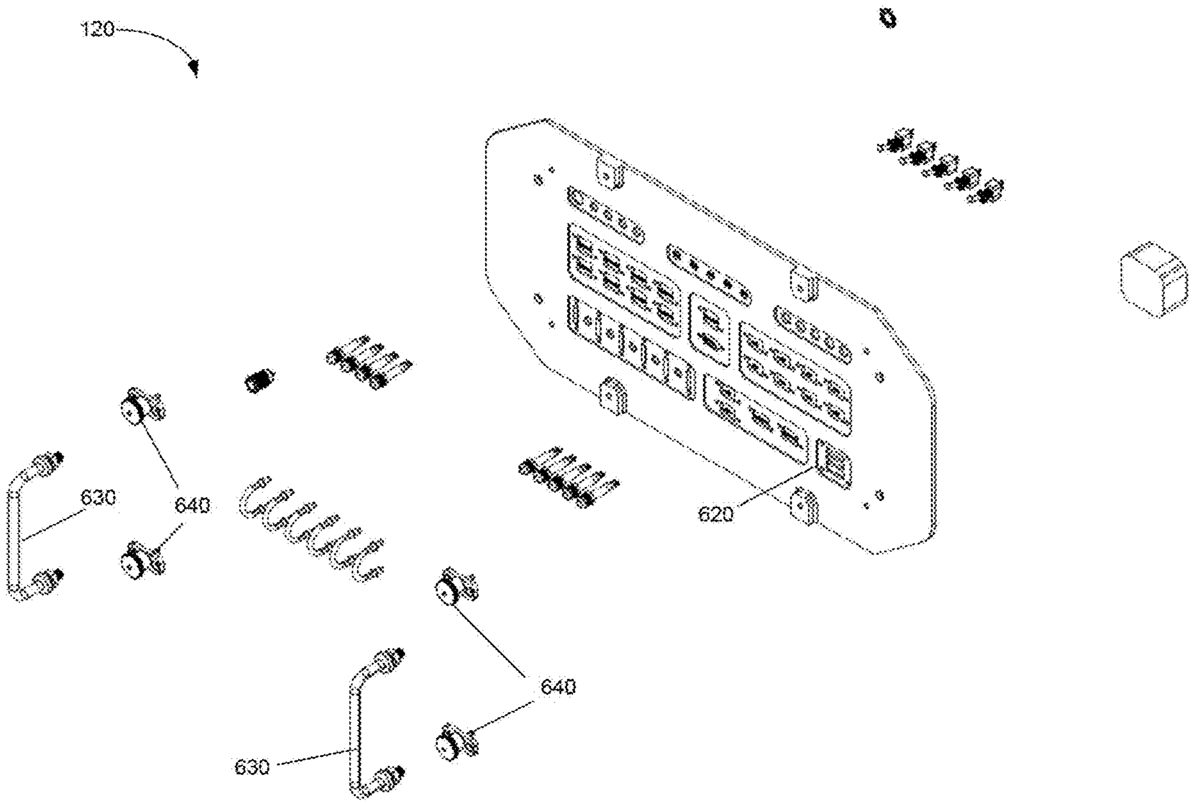
FIG. 8 is an exterior exploded perspective view of the isolated subassembly of the anterior end cap of FIG. 6.

FIG. 8 is an exterior exploded perspective view of the isolated subassembly of the anterior end cap 120 of FIG. 6. Four plungers 640 disposed near four corners are used to attach the anterior end cap 120 to the top hatch 130 and bottom hatch 132 to seal the enclosure 100.

First Side and Second Side with Fans

Figure 9:
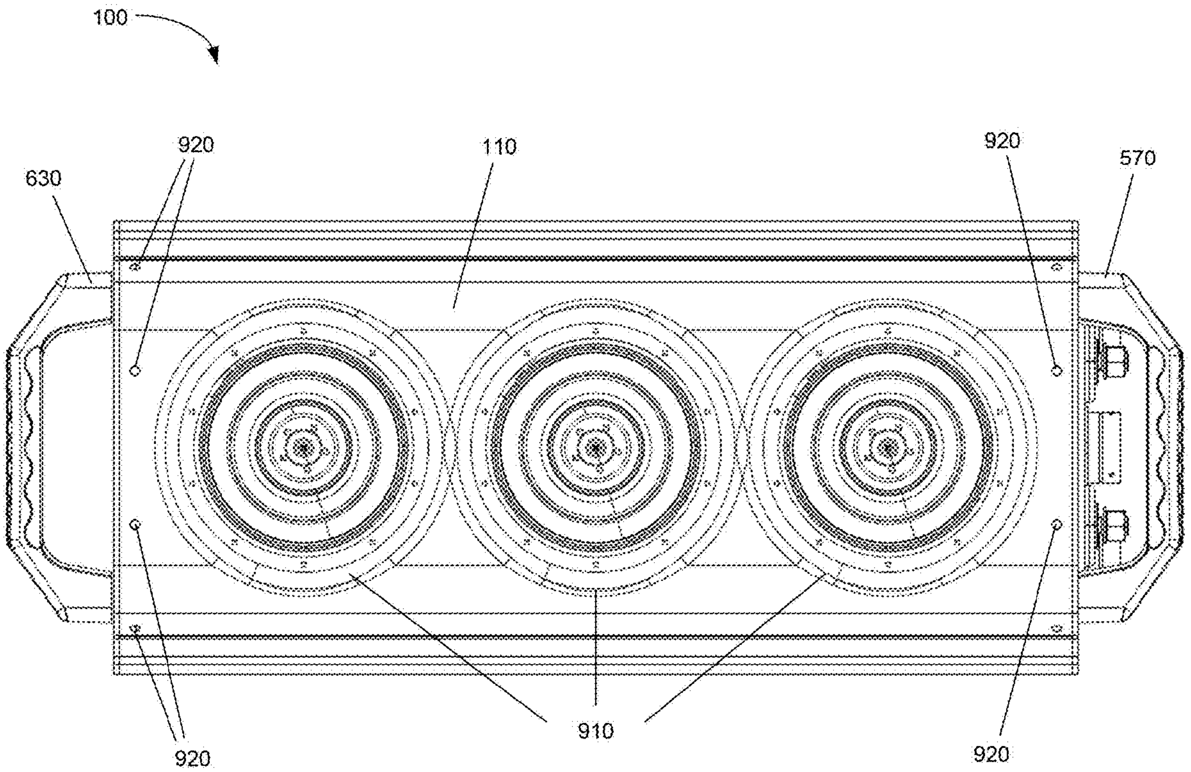
FIG. 9 is an exterior elevational view illustrating an example of a first side of the enclosure having a plurality of radial blower impeller fans.

FIG. 9 is an exterior elevational view illustrating an example of the first side 110 of the enclosure 100 having a plurality of radial blower impeller fans. The figure shows three impeller fans 910 which are located to face directly outward on the first side. Also shown here are four holes 920 on each end of the lateral side segment 110. The holes 920 are situated to secure the first side 110, using fasteners, to the aforementioned protruding lip 440 of the posterior end cap 122 which has handles 450 (FIGS. 3-5) and to the protruding lip 710 of the anterior end cap 120 which has handles 630 (FIGS. 6 and 7), for a strong mechanical seal and structural integrity.

The second side 112 may be identical to the first side 110 and have three radial blower impeller fans 912 (see FIG. 11) and four holes.

Figure 10:
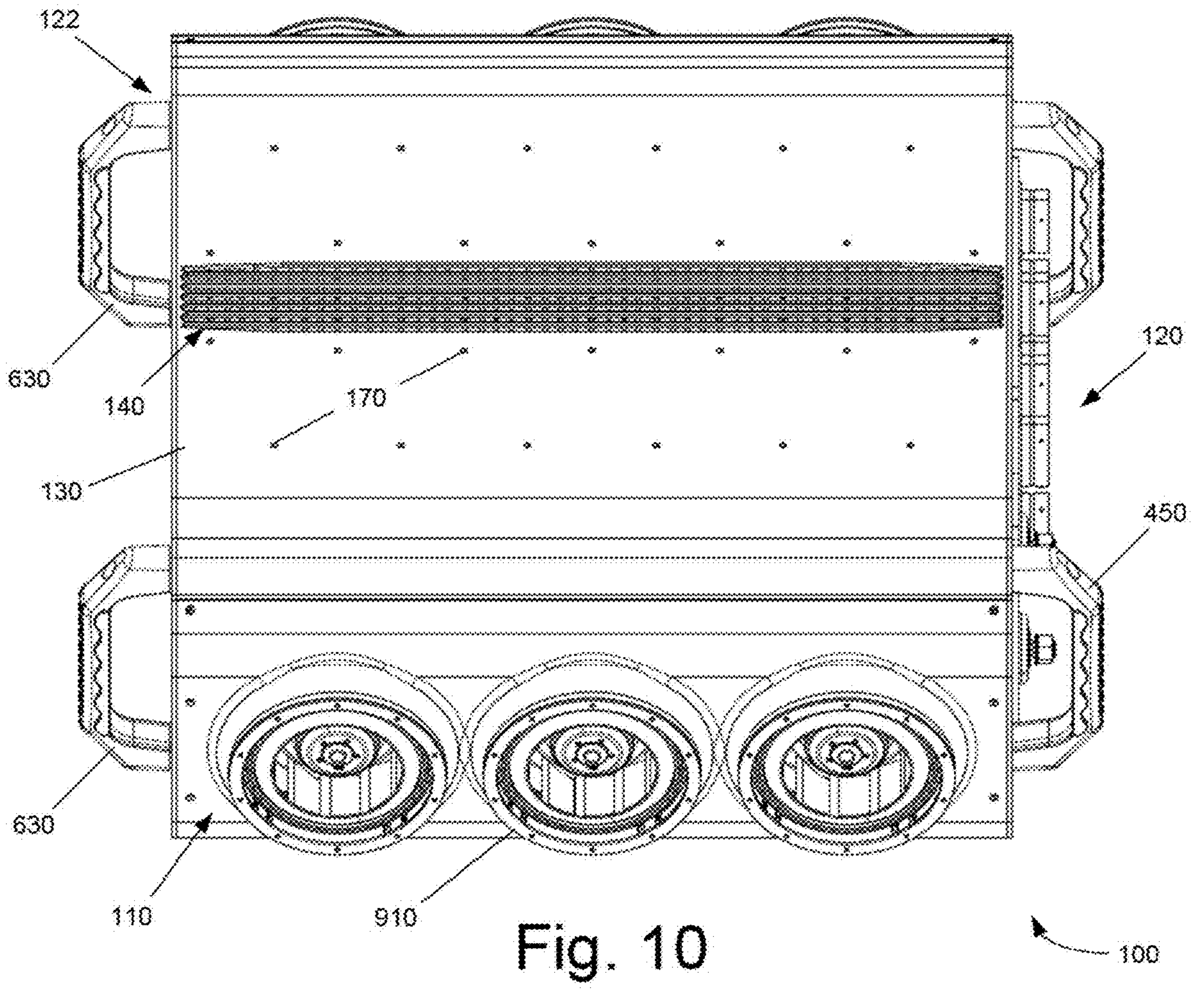
FIG. 10 is an angled exterior elevational view of the first side of FIG. 9 and the top hatch of the enclosure.

FIG. 10 is an angled exterior elevational view of the first side 110 of FIG. 9 and the top hatch 130 of the enclosure 100. The top vent 140 runs the length of the top hatch 130 from the anterior end cap 120 to the posterior end cap 122. As explained in more detail later, the top vent 140 and the bottom vent 142 are where air introduced by the impeller fans 910 of the first side 110 and the impeller fans 912 of the second side 112 escapes after traveling through the internal lattice structure of the enclosure 100. The top hatch 130 has a plurality of holes 170 (e.g., 26 holes) which are used for a number of purposes. Some holes 170 are used to secure an interface panel (2110 in FIG. 21) housed below the top hatch 130, to be described in more detail later. Some holes 170 can be used as additional mounting points for accessories such as NATO rails or other items deemed necessary.

Figure 11:
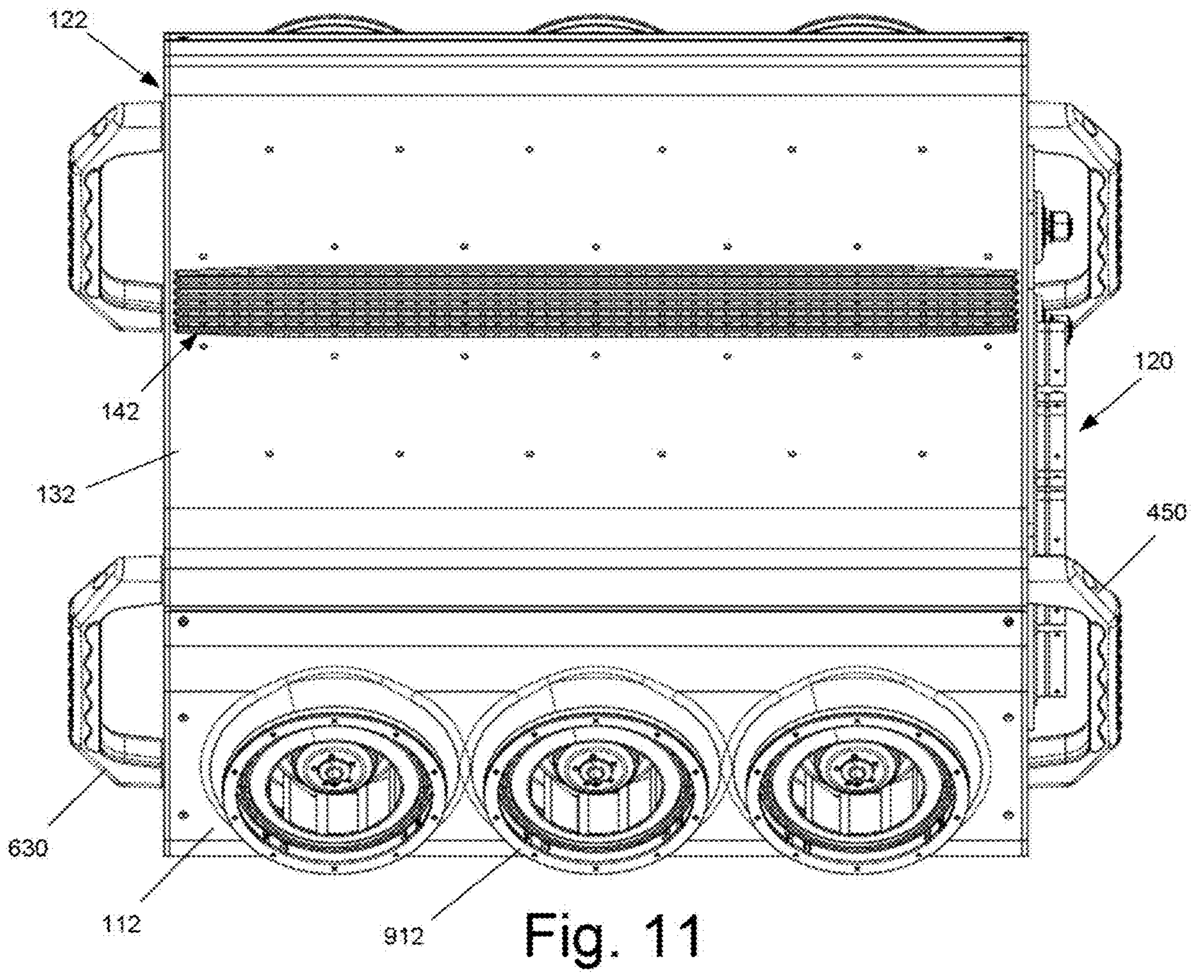
FIG. 11 is an angled elevational view of an example of the second side and the bottom hatch of the enclosure.

FIG. 11 is an angled elevational view of an example of the second side 112 and the bottom hatch 132 of the enclosure 100. As seen, the second side 112 includes three radial blower impeller fans 912 similar or identical to the impeller fans 910 of the first side 110. The first side 110 and the second side 112 may be identical. They may be DMLS parts formed by 3D printing additive manufacturing or other methods to include lattice structures. So are the top hatch 130 and the bottom hatch 132.

Figure 12:
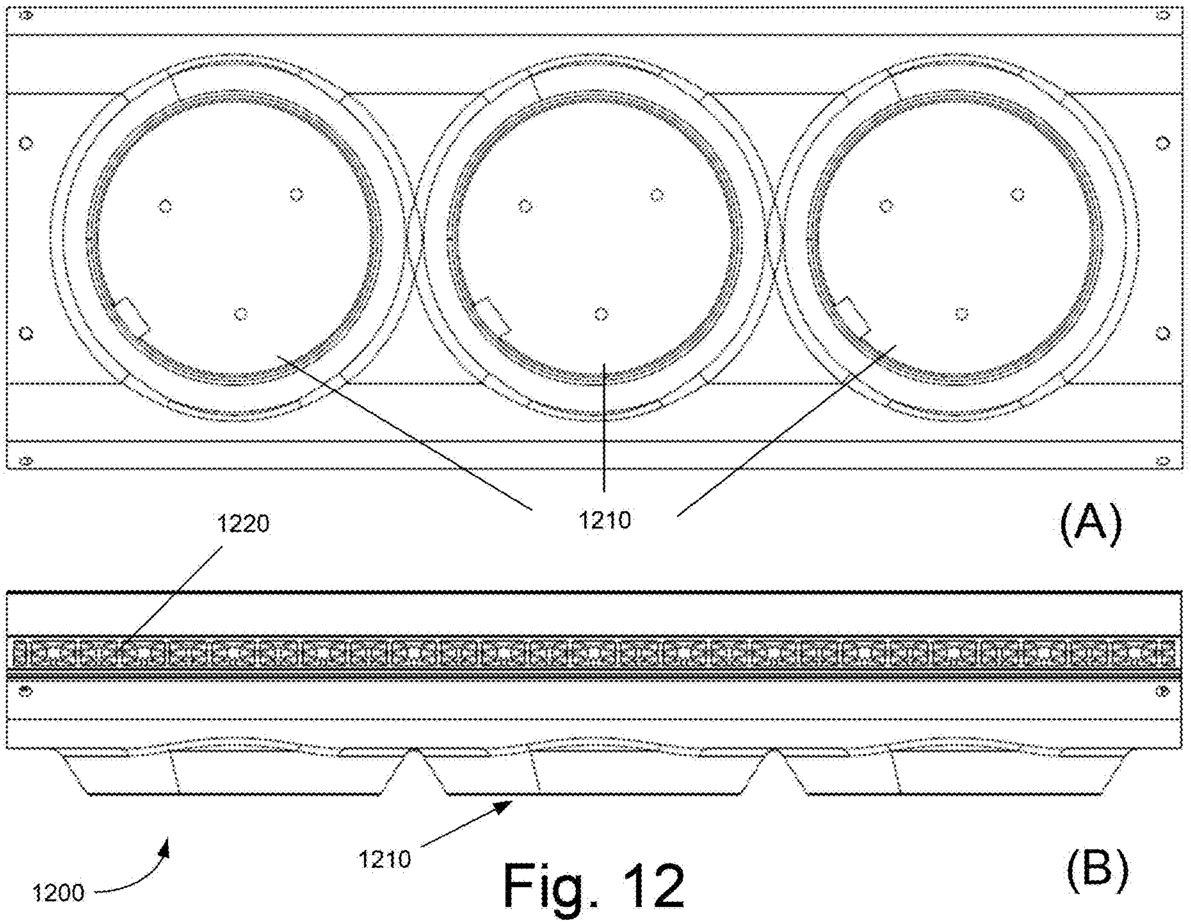
FIG. 12 shows (A) a front elevational view and (B) a top plan view of a side body of the first side or the second side of the enclosure.

FIG. 12 shows (A) a front elevational view and (B) a top plan view of a side body 1200 of the first side 110 or the second side 112. Each side body 1200 as shown is an isolated view of a lateral side segment having three openings 1210 before installation of the impeller fans 910 or 912. The view (B) illustrates part of the visible side body lattice exit 1220 embedded within the side body 1200. Once air is introduced by the three impellers fans (910 or 912), it exits through the side body lattice exit 1220 of the overall system lattice where the side body lattice exit 1220 mates with the lattice structure of the top hatch 130 which leads to the top vent 140 and where the side body lattice exit 1220 mates with the lattice structure of the bottom hatch 132 which leads to the bottom vent 142.

Figure 13:
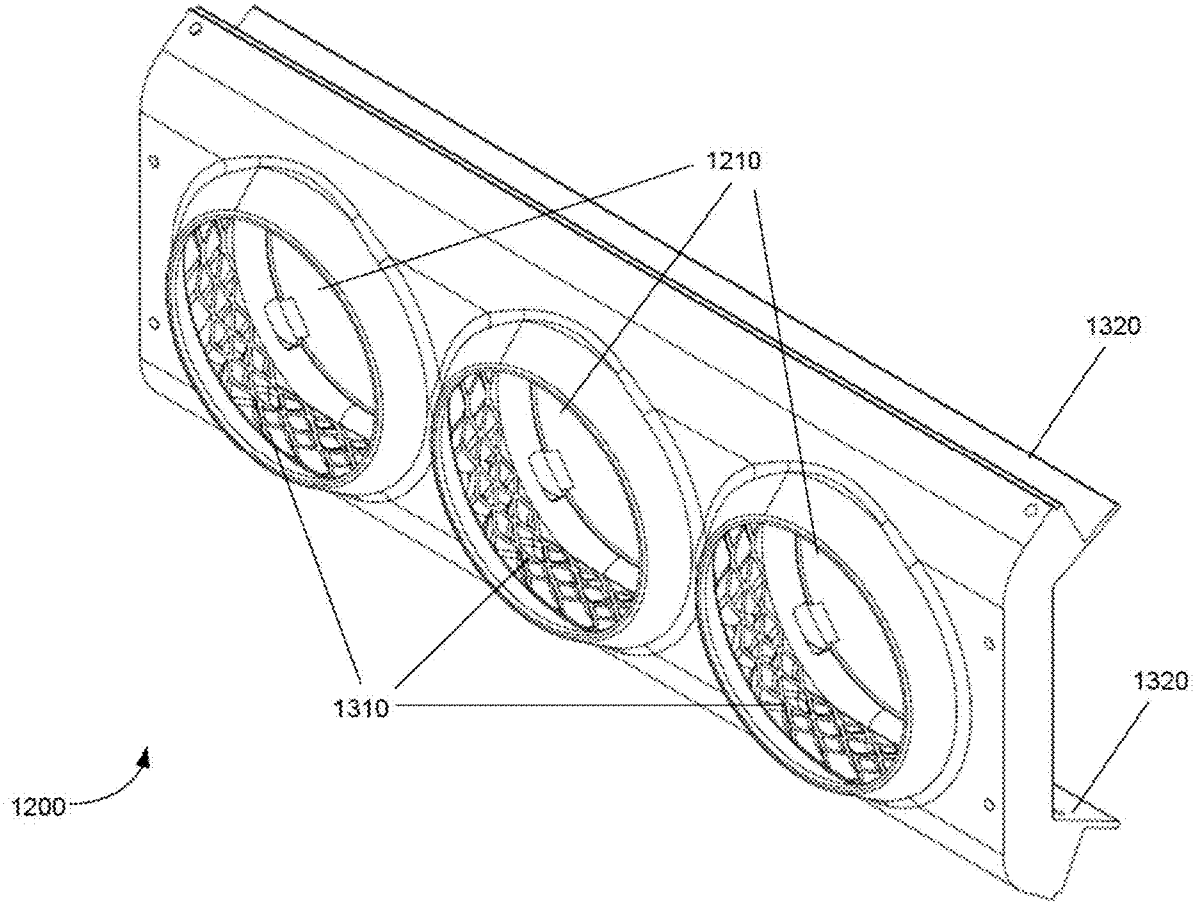
FIG. 13 is a perspective view of the side body of FIG. 12.

FIG. 13 is a perspective view of the side body 1200 of FIG. 12. This view illustrates part of the visible side body opening lattice structure 1310 that immediately directs the air introduced by the three impeller fans (910 or 912) into the overall system lattice of the enclosure 100. It further shows a pair of flanges 1320 that run the full length of the side body 1200 and support the top hatch 130 and the bottom hatch 132. These flanges 1320 act as one part of the double mechanical seal with the top hatch 130 and the bottom hatch 132 to provide a strong mechanical seal and structural integrity.

Figure 14:
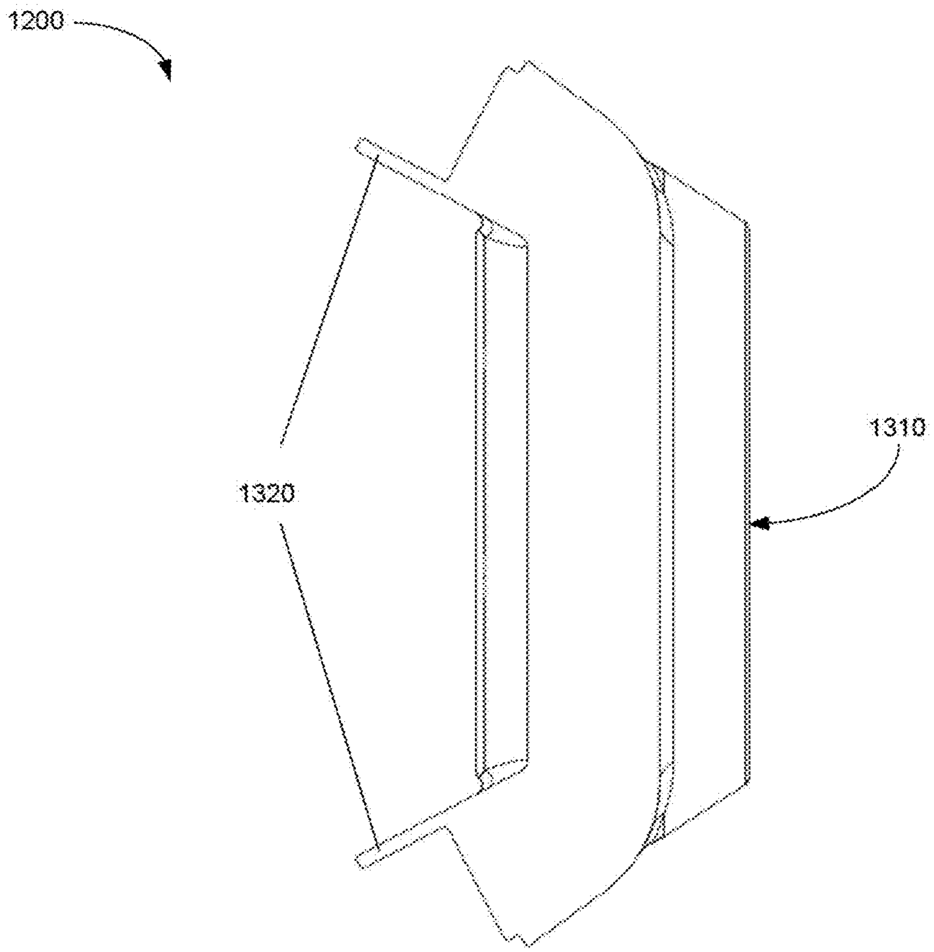
FIG. 14 is a side view of the side body of FIG. 12.

FIG. 14 is a side view of the side body 1200 of FIG. 12. It shows another view of the flanges 1320 for creating the double mechanical seal with the top hatch 130 and the bottom hatch 132.

Figure 15:
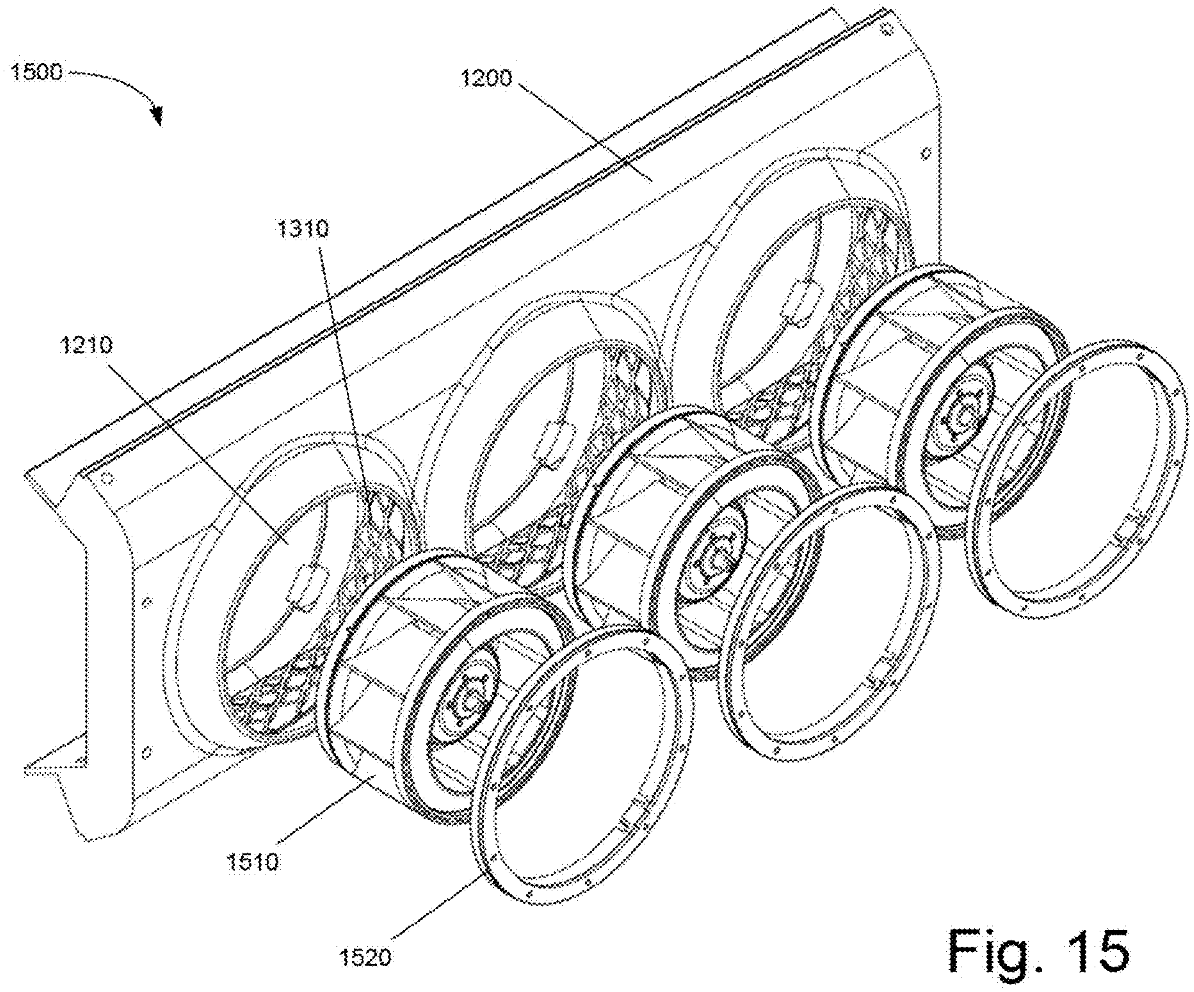
FIG. 15 is an exploded perspective view of an example of a side subassembly of the first side or the second side of the enclosure.

FIG. 15 is an exploded perspective view of an example of a side subassembly 1500 of the first side 110 or the second side 112 of the enclosure 100 including a side body 1200, fans 1510, and filter rings 1520. The embodiment shown has three radial blower impeller fans 1510 and three associated filter rings 1520. The fans 1510 are sunk into the side body 1200 with the side body opening lattice structure 1310 and sit just below flush with the openings 1210 of the side body 1200. The filter rings 1520 are fitted in a snap lock fashion. The fans 1510 are meant to be assembled with a filter material that is suitable for the intended application. The fans 1510 may also be designed to operate without a filter if desired. In one embodiment, the filter rings 1520 are each formed by two parts that are bolted together to create a compression around a filter material that subsequently seals the filter material in place.

Figure 16:
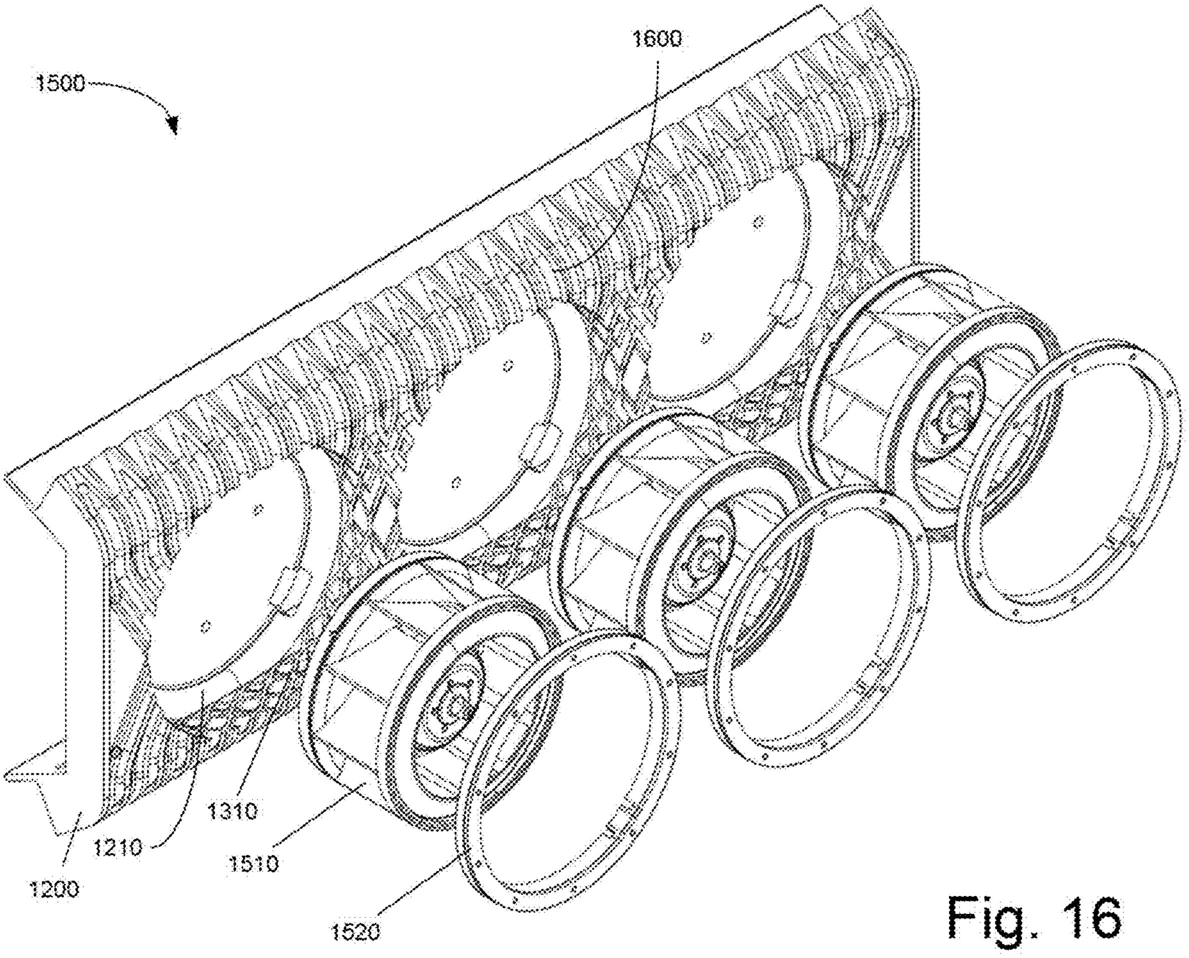
FIG. 16 is an exploded perspective view of the side subassembly of FIG. 15 with the outer wall or skin of the side body removed to illustrate the interior structure.

FIG. 16 is an exploded perspective view of the side subassembly 1500 of FIG. 15 with the outer wall or skin of the side body 1200 removed to illustrate the interior structure 1600. As illustrated, embedded behind the outer wall lies a full view of the side body lattice structure 1600 of which the side body opening lattice structure 1310 is a portion. Taking a closer look at the side body opening lattice structure 1310 surrounding each fan opening 1210, the geometry warps in such a way to efficiently direct all output from the fan 1510 into the top hatch 130 and the bottom hatch 132. Creating a geometry that gently guides airflow from 360 degrees of each fan impeller ensures a laminar air flow (or at least substantially laminar) through the lateral side segments of the first side 110 and the second side 112 with no excessive back pressure on the fans 1510. This is designed so that when the air reaches the critical heat exchange areas in the top hatch 130 and the bottom hatch 132, the overall system lattice structure can create some turbulent airflow to increase heat exchange capacity in the critical heat exchange areas.

Figure 17:
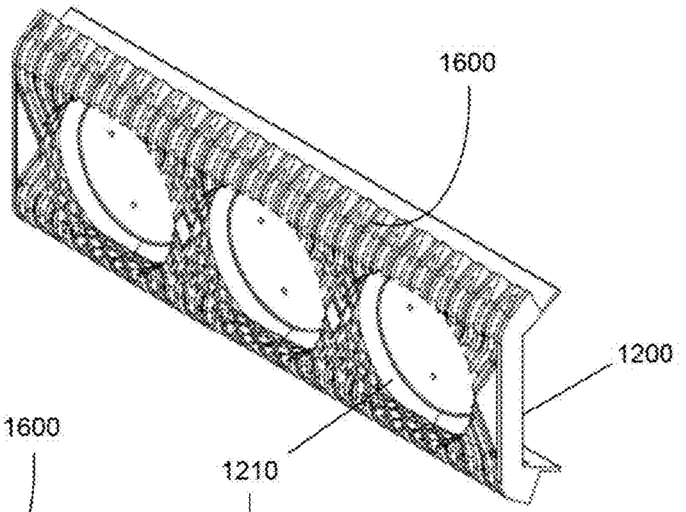
FIG. 17 shows (A) a perspective view and (B) an exterior elevational view of the side body of the side subassembly of FIG. 15 with the outer wall or skin removed to illustrate the side body interior structure.
Figure 17:
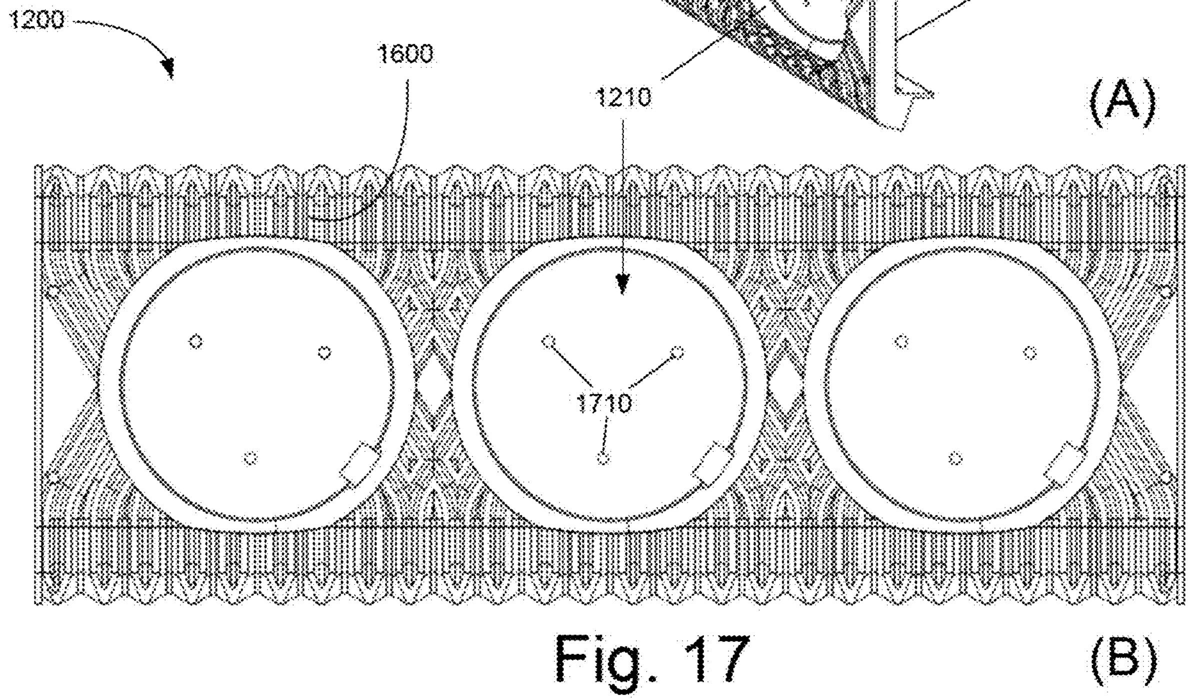

FIG. 17 shows (A) a perspective view and (B) an exterior elevational view of the side body 1200 of the side subassembly 1500 of FIG. 15 with the outer wall or skin removed to illustrate the side body interior structure 1600. The view (B) in particular shows more clearly how exactly the lattice geometry is formed around the fan openings 1210 to produce the laminar flows through the side body 1200. Also seen in each fan opening 1210 are three mounting holes 1710 used for assembling or attaching the impeller fans 1510 to the side body 1200.

Figure 18:
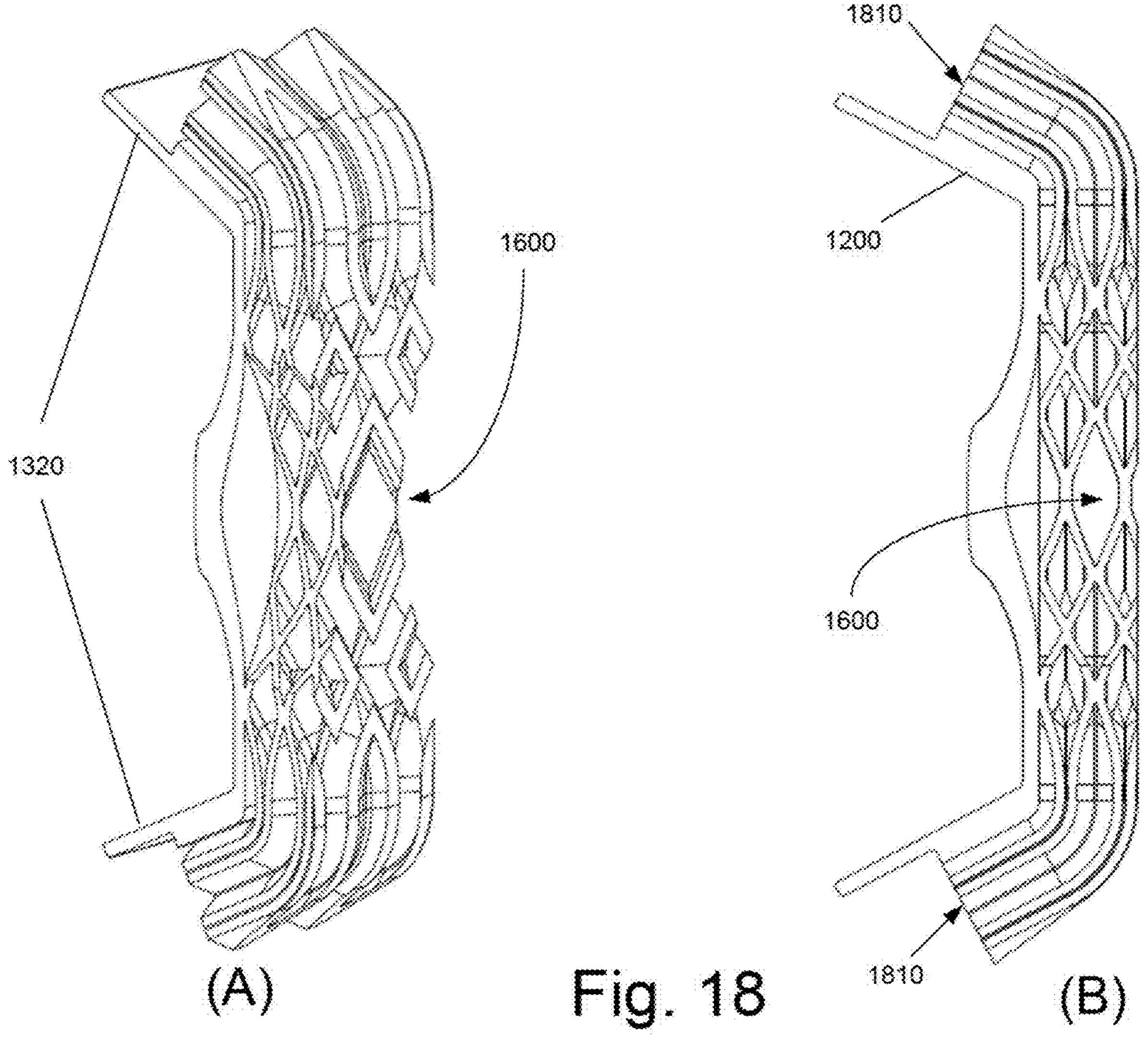
FIG. 18 shows (A) an angled side view and (B) a lateral side view of the side body interior structure of the side body of FIG. 17.

FIG. 18 shows (A) an angled side view and (B) a lateral side view of the side body interior structure 1600 of the side body 1200 of FIG. 17. They are both sliced to show an in-depth view of different internal chambers or channels in the side body lattice structure 1600. The lattice is directional in part to ensure the air enters and exits in the intended locations within the enclosure 100. At the same time, there is limited cross flow between the internal chambers or channels to minimize or avoid the introduction of turbulent airflow and to allow dispersion throughout the walls of each side body 1200. In contrast, the top hatch 130 and the bottom hatch 132 include lattice structures designed to produce turbulent air flow so that when the air reaches the critical heat exchange areas in the top hatch 130 and the bottom hatch 132, the lattice structures can increase heat exchange capacity in the critical heat exchange areas (e.g., with CPU, GPU, or the like).

As seen in FIGS. 16-18, the side body lattice structure 1600 has a core with core portions near the flanges 1320 that are arcuate. As best seen in FIG. 18, the core has core faces 1810 for airflow to exit or enter the core near the flanges 1320. The internal channels of the core may be configured to direct the airflow that is perpendicular to the core faces.

Top Hatch & Bottom Hatch

Figure 19:
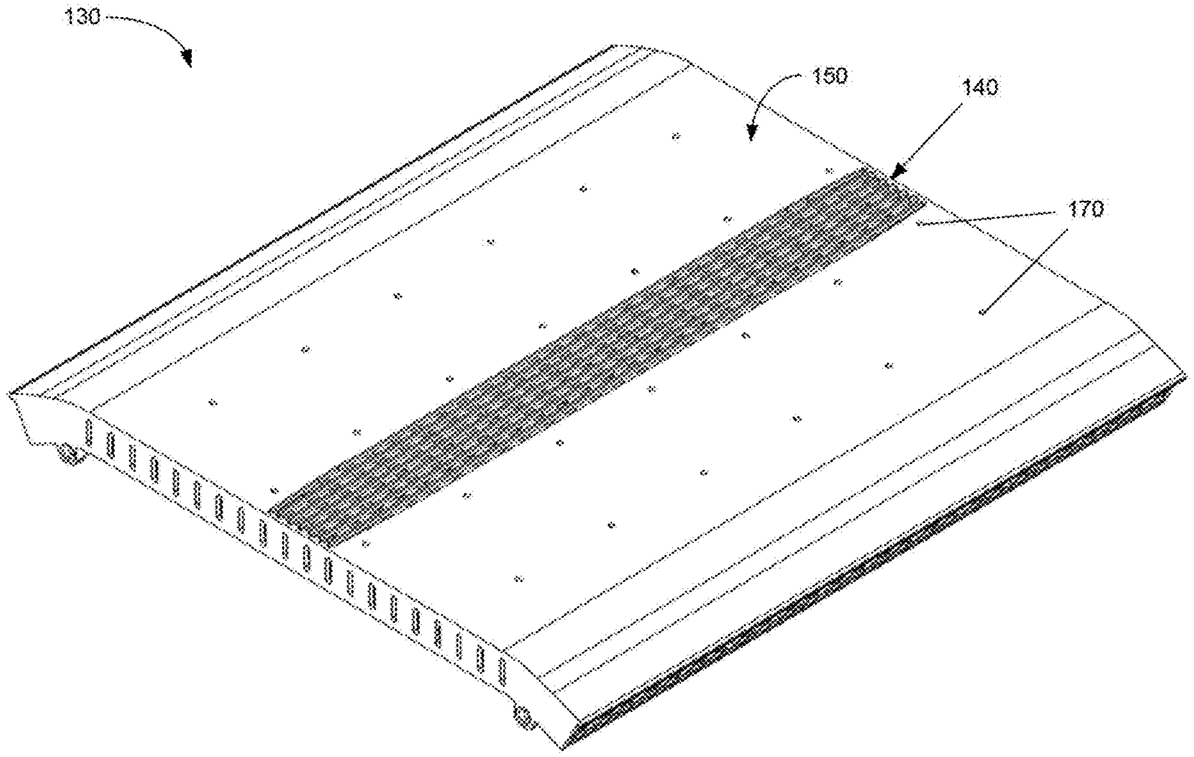
FIG. 19 is an upper perspective view of the top hatch of the enclosure.

FIG. 19 is an upper perspective view of the top hatch 130 of the enclosure 100. The top hatch 130 has an outer wall or skin 150 with a top vent 140 and a plurality of holes 170 as described above. The bottom hatch 132 may be similar or identical to the top hatch 130. The angled configuration at opposite sides are configured to engage the flanges 1320 of the side bodies 1200 of the first side 110 and the second side 112 for creating the double mechanical seals.

Figure 20:
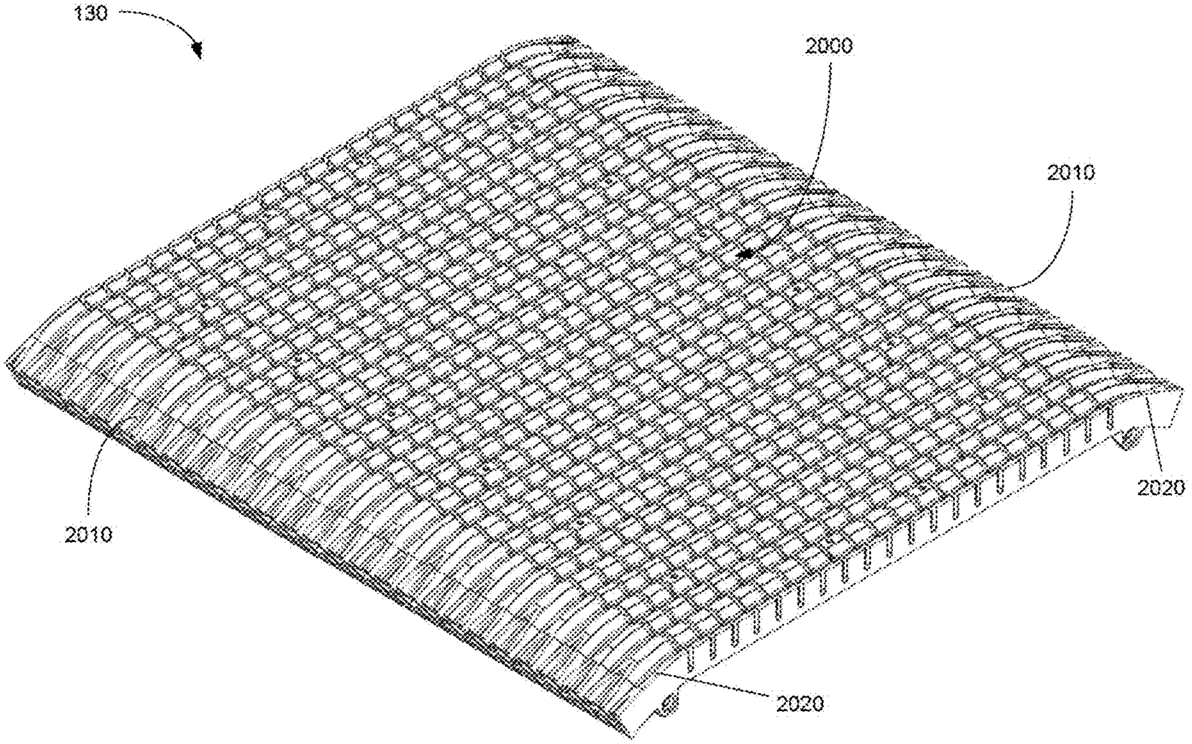
FIG. 20 is an upper perspective view of the top hatch of FIG. 19 with the outer wall or skin removed to show the interior structure.

FIG. 20 is an upper perspective view of the top hatch 130 of FIG. 19 with the outer wall or skin 150 removed to show the interior structure 2000. The top hatch lattice structure 2000 inside the top hatch 130 directs the air from the intersection with the lateral side segments of the first side 110 and the second side 112 across the top hatch 130 to the top center exit vent 140. The chambers 2010 are shaped in the lateral direction so that a ridge 2020 meets the outer wall 150 which has been removed in this view. There is little contact area between these ridges 2020 and the outer wall 150. This ensures that the outer wall 150 is heavily utilized as a heat exchanger with the ambient air located inside the lattice 2000 and the ambient air outside of the enclosure 100. This promotes an efficient thermal exchange so that there is not a large, saturated portion of the enclosure structure (e.g., aluminum structure) retaining the thermal energy.

Figure 21:
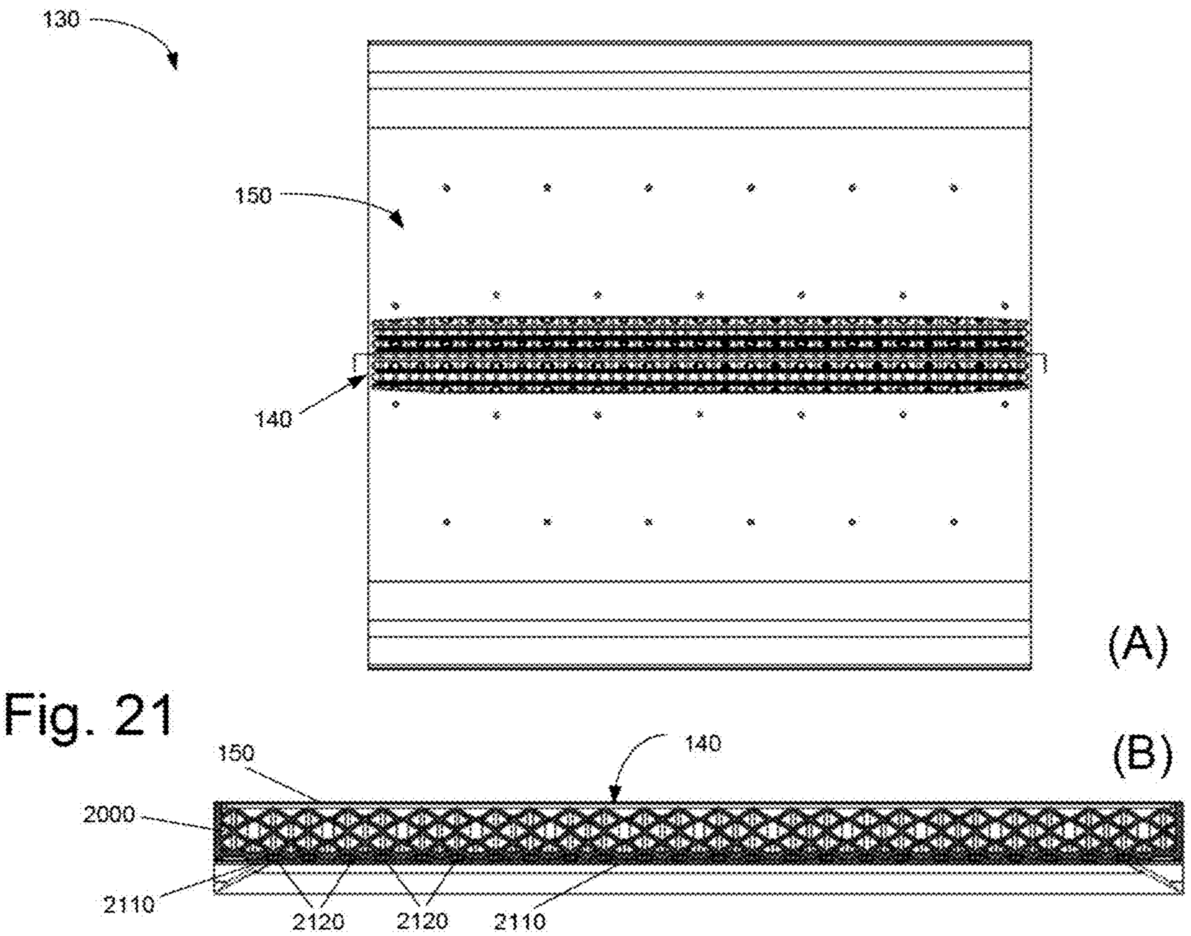
FIG. 21 shows (A) a top plan view and (B) a side cross-sectional view of a top hatch assembly taken along the length of the top vent according to an embodiment.

FIG. 21 shows (A) a top plan view and (B) a side cross-sectional view of a top hatch assembly taken along the length of the top vent according to an embodiment. In the top hatch subassembly as shown, the top hatch 130 is spaced from an interface panel 2110. A flat arrangement of heat pipes 2120 is disposed between the top hatch 130 having the top vent 140 and the interface panel 2110. The view (B) better shows the stacked chambers of the top hatch lattice structure 2000 inside the additive manufactured lattice structure. The density is designed to increase surface area for thermal capacity while not being so dense as to create excessive back pressure on the fans 1510 of the first side 110 and the second side 112. The flat arrangement of heat pipes 2120 are nestled between the top hatch lattice structure 2000 and the interface panel 2110. The flat heat pipes 2120 contact both the top hatch lattice structure 2000 and the interface panel 2110 through compression which is created by force of the through bolts in the top hatch.

In embodiments, the heat pipes 2120 form a first closed system of one or more first heat pipes including a first working fluid flowing therein. The first heat pipes are disposed adjacent to or in contact with the turbulent core portion of the monolithic heat exchanger provided by the top hatch lattice structure 2000 of the top hatch 130. The first closed system of one or more first heat pipes 2120 is integrally formed as an integrated part of the enclosure wall structure (i.e., top hatch 130) and nestled into dimples of the monolithic heat exchanger with the top hatch lattice structure 2000.

Figure 22:
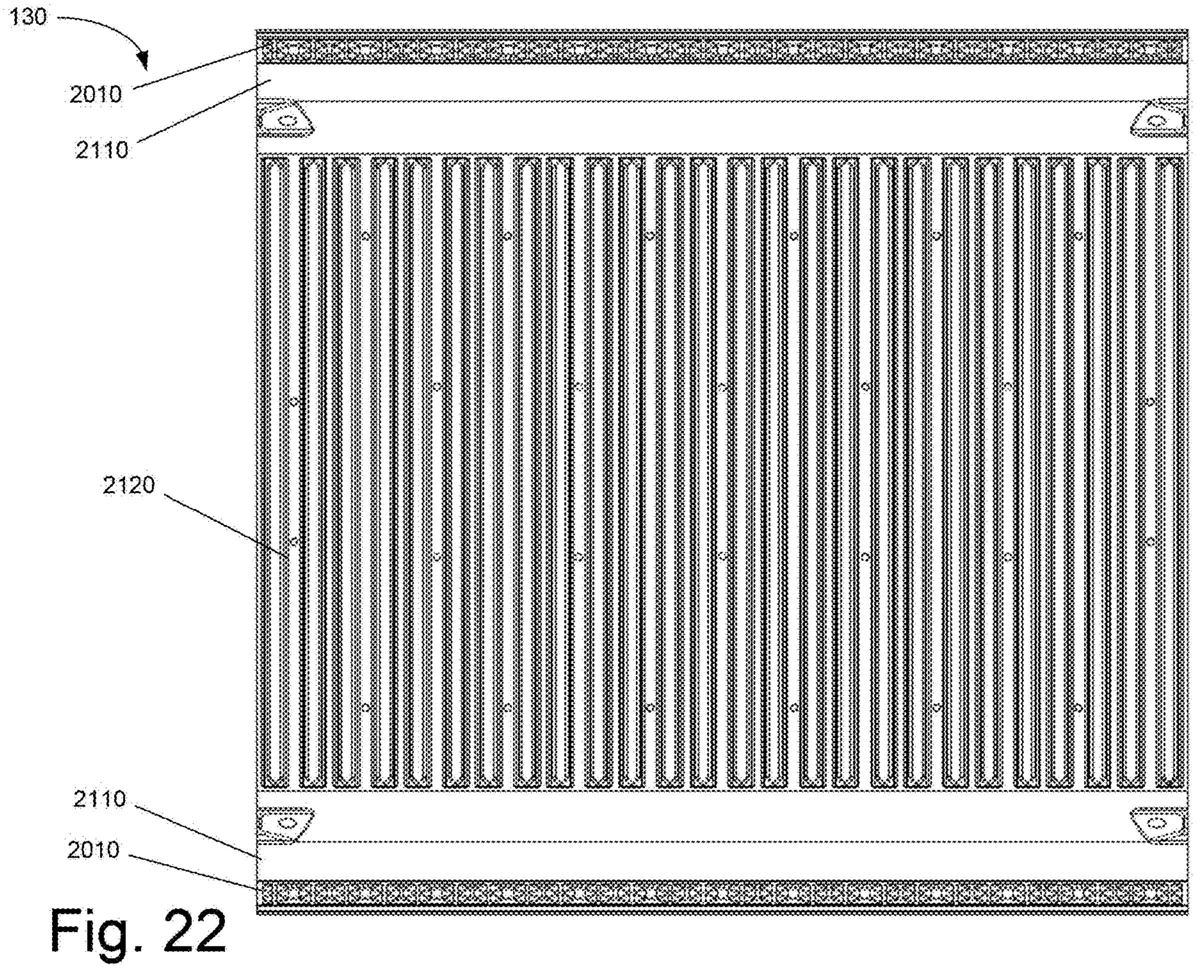
FIG. 22 is top plan view of an interior of the top hatch of FIG. 21 illustrating the heat pipes.

FIG. 22 is top plan view of an interior of the top hatch 130 of FIG. 21 illustrating the heat pipes 2120. Disposed on opposite sides of the top hatch lattice structure 2000 are the chambers 2010 that receive air flow from the lateral side segments of the first side 110 and the second side 112 which travels through the top hatch lattice structure 2000 to the top center exit vent 140. The integrated heat pipes 2120 are used in a classic fashion to rapidly transfer thermal energy from one area to another. In this case, the heat pipes 2120 are used to take any concentrated heat, especially from the CPU block, and transfer it across the top hatch 130. This is done to prevent saturating any of the additive manufactured parts that include lattice structures to facilitate the air flow therethrough to provide heat transfer functions. This could happen in an extreme scenario if the thermal energy builds in a concentrated area and continues to expand across the system lattice structure, eventually reaching a point of saturation. This can be prevented for the intended components to be cooled, as long as the heat is spread efficiently so that airflow through the system lattice can properly remove thermal energy from the enclosure materials. FIG. 22 demonstrates how the heat pipes 2120 may be integrated into the full subassembly. The heat pipes 2120 contain a working fluid in a closed system which transfers thermal energy quickly from one end of the pipe to the other through phase change and convention. The working fluid may be distilled water with an optional additive.

Computer Enclosure Interior

Figure 23:
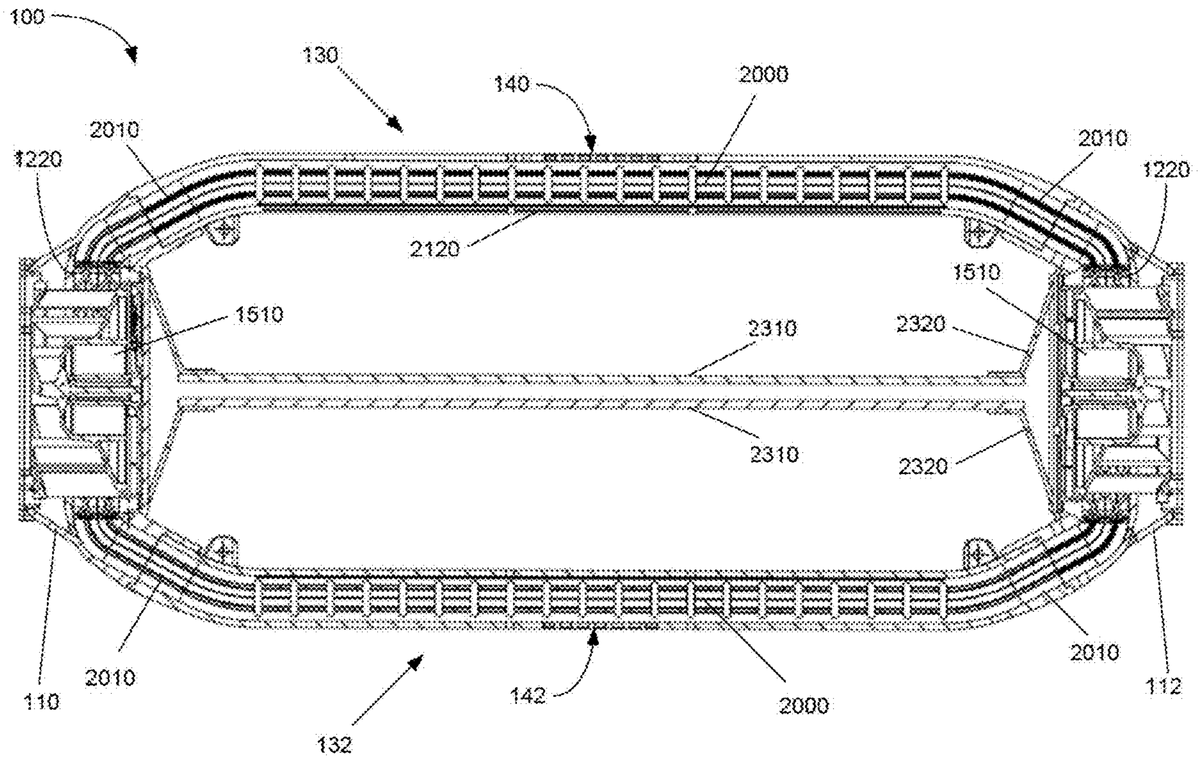
FIG. 23 is a cross-sectional view of the enclosure of FIG. 1 illustrating the interior structures of the top hatch, the bottom hatch, the first side, and the second side.

FIG. 23 is a cross-sectional view of the enclosure 100 of FIG. 1 illustrating the interior structures of the top hatch 130, the bottom hatch 132, the first side 110, and the second side 112. The top hatch 130 and the bottom hatch 132 each include a top/bottom hatch lattice structure 2000 coupled to the chambers 2010 on both sides which are fluidically coupled to the side body lattice exits 1220 of the first side 110 and the second side 112, and to the side body lattice structures 1600, respectively. Air is driven by the impeller fans 1510 through the side body lattice structures 1600 of the first side 110 and the second side 112, and through the top/bottom hatch lattice structures 2000 of the top hatch 130 and the bottom hatch 132 to the center exit vents which are the top vent 140 and the bottom vent 142, respectively. The top hatch 130 further includes the integrated heat pipes 2120 to rapidly transfer thermal energy from a CPU block with concentrated heat to the top hatch 130 and out of the enclosure 100. The heat pipes 2120 work to take the concentrated thermal energy from the CPU block and spread it across the entire hatch 130 or 132 and the lattice structure 2000 contained therein.

In the interior of the enclosure 100 are shelves 2310 and shelf supports 2320. The figure shows an example of how the shelves 2310 are mounted utilizing the shelf support brackets 2320 on opposite sides which are bolted into the lateral side segments of the first side 110 and the second side 112, respectively. The first side 110 and the second side 112 provide symmetric lateral side segments that act as semi-permanent structures of the enclosure 100. One of the purposes they serve is as a mounting structure in the system to which the component shelves 2310 are secured.

Compression pads may be disposed between the two shelves 2310. These pads would be used to separate the shelves 2310 and ensure their respective contacts with their corresponding shelf supports 2320. The pads can also be used to provide shock dampening effects for a motherboard, GPU (Graphics Processing Unit), power supply, and other components that may be mounted to the shelves 2310. The shelf 1100 may be made of metal such as aluminum to provide a secure mounting location for a variety of computer or electronic components. The shelf supports 2320 may be formed out of aluminum sheet metal or the like, in a way that provides rigidity while at the same time flexibility to account for shock and vibration. The compression pads may be made of silicon mainly.

Figure 24:
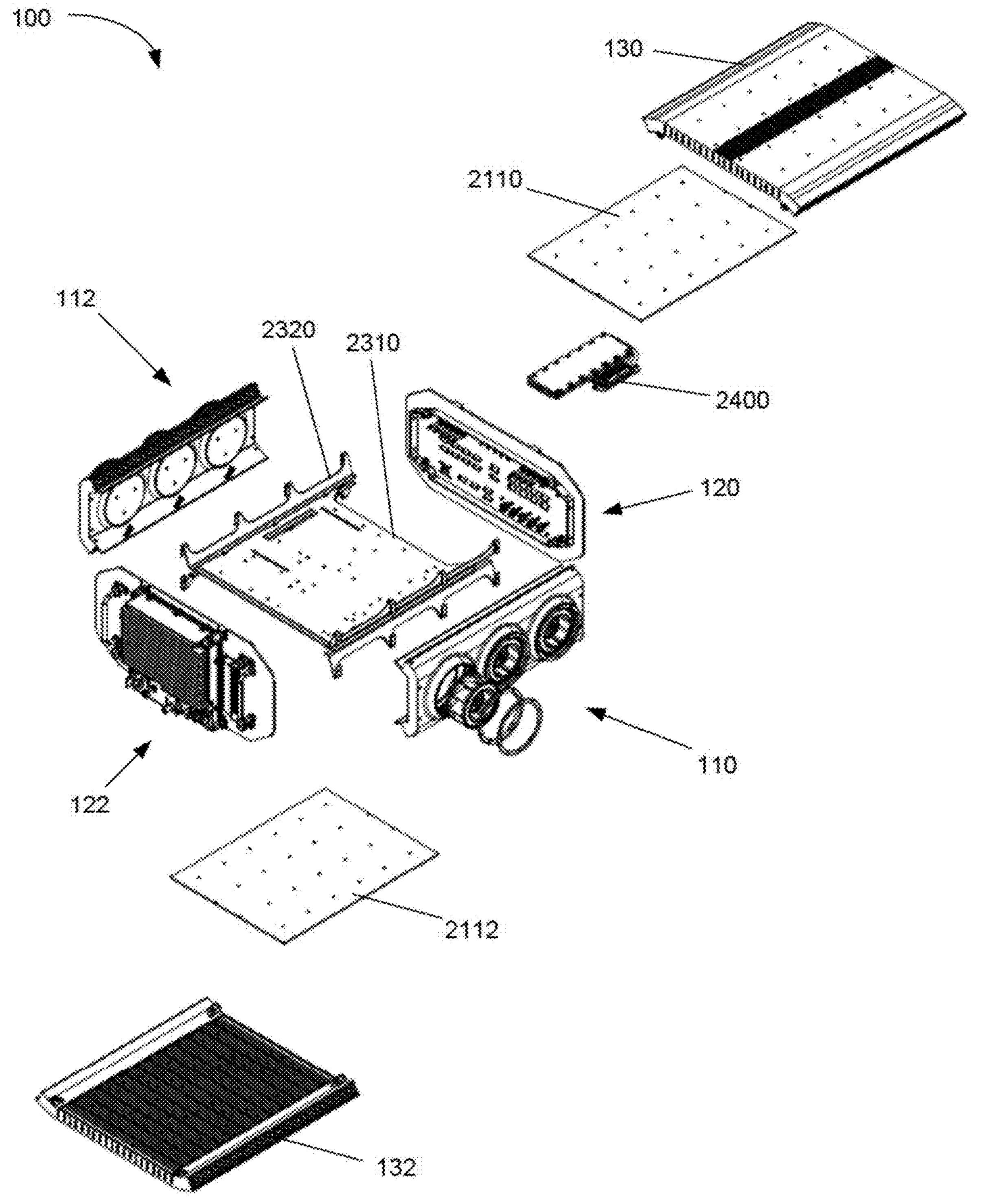
FIG. 24 is an exploded view of the enclosure of FIG. 1 illustrating the interior components as well as the exterior components.

FIG. 24 is an exploded view of the enclosure 100 of FIG. 1 illustrating the interior components as well as the exterior components, including many, if not all, of the larger critical components for a functioning enclosure 100. The exterior components include the top hatch 130 and the top interface panel 2110 of FIGS. 19-22, the bottom hatch 132 and a bottom interface panel 2112, the first side 110 and the second side 112 of FIGS. 9-18, the first end cap or anterior end cap 120 including the control panel of FIGS. 6-8, and the second end cap or posterior end cap 122 including the sealed power converter 410 of FIGS. 3-5. Disposed in the interior of the enclosure 100 are the shelves 2310 and shelf supports 2320 of FIG. 23, and a CPU block 2400.

Figure 25:
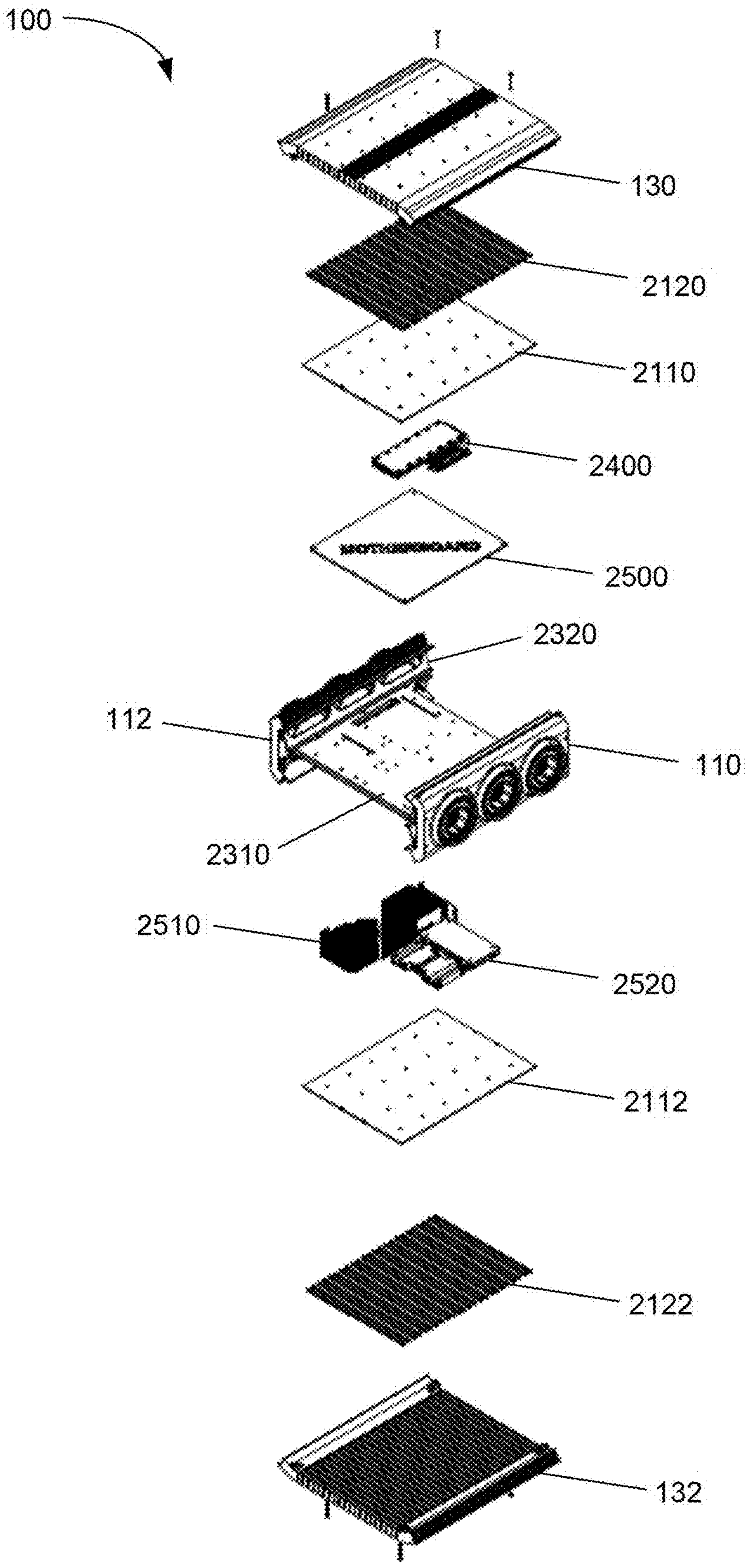
FIG. 25 is an exploded view of the enclosure of FIG. 1 without the first end cap or anterior end cap and without the second end cap or posterior end cap.

FIG. 25 is an exploded view of the enclosure 100 of FIG. 1 without the first end cap or anterior end cap 120 and without the second end cap or posterior end cap 122. The components shown include the top hatch 130 with the integrated heat pipes 2120, the top interface panel 2110, the CPU block 2400, a motherboard 2500, the first side 110, the second side 112, the shelves 2310 and shelf supports 2320, a GPU 2510 and DC-DC ATX (Advanced Technology EXtended) power supplies 2520, the bottom interface panel 2112, and the bottom hatch 132 with integrated heat pipes 2122. These parts represent an example of what could be integrated or included in the enclosure 100. The power supplies in this embodiment would accept the output from the externally mounted power converter 410 of the second end cap 122 and provide appropriate power output to components such as the motherboard 2500 and GPU 2510 housed inside the enclosure 100. The integrated heat pipes 2120 of the top hatch 130 are used to rapidly transfer thermal energy from the CPU block 2400 with concentrated heat to the top hatch 130 and out of the enclosure 100. The integrated heat pipes 2122 of the bottom hatch 132 are used to rapidly transfer thermal energy from the GPU 2510 and DC-DC ATX power supplies 2520 with concentrated heat to the bottom hatch 132 and out of the enclosure 100. The DC-DC ATX power supply eliminates the need for a large inverter onboard to power a standard AC-DC ATX power supply.

Figure 26:
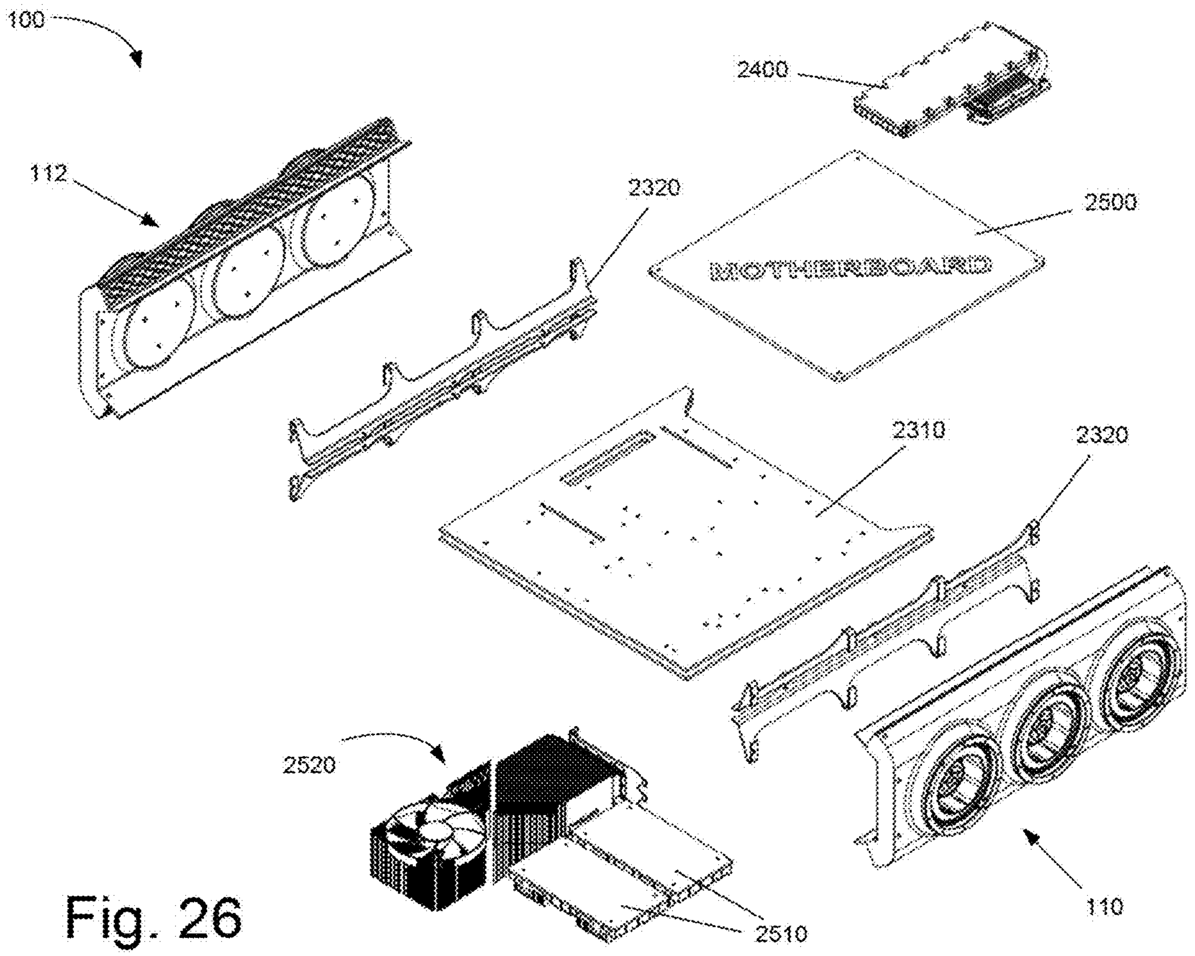
FIG. 26 is an exploded view of the enclosure of FIG. 1 without the top hatch and top interface panel, the bottom hatch and bottom interface panel, the first end cap or anterior end cap, and the second end cap or posterior end cap.

FIG. 26 is an exploded view of the enclosure 100 of FIG. 1 without the top hatch 130 and top interface panel 2110, the bottom hatch 132 and bottom interface panel 2112, the first end cap or anterior end cap 120, and the second end cap or posterior end cap 122. This view provides a closer look at the CPU block 2400 which is used to rapidly transfer thermal energy from the CPU on the motherboard 2500. The CPU typically generates the highest concentration of thermal energy in a computer and thus requires a specialized block to wick away that energy and move it elsewhere for thermal transfer. The shelves 2310 each include many visible through holes. These are mounting holes for a plurality of components including those shown in these drawings. The shelves 2310 may include additional holes to accommodate the mounting of not only one specific motherboard configuration but a variety of common motherboard configurations. The system enclosure 100 is designed in size and thermal transfer capabilities to handle any commercial off the shelf motherboard 2500, CPU, and dual GPUs 2510. This means up to an E-ATX styles motherboard and two full size GPUs. In other examples, the system enclosure 100 is designed for a dual socket motherboard with dual GPUs or two motherboards.

CPU Block

Figure 27:
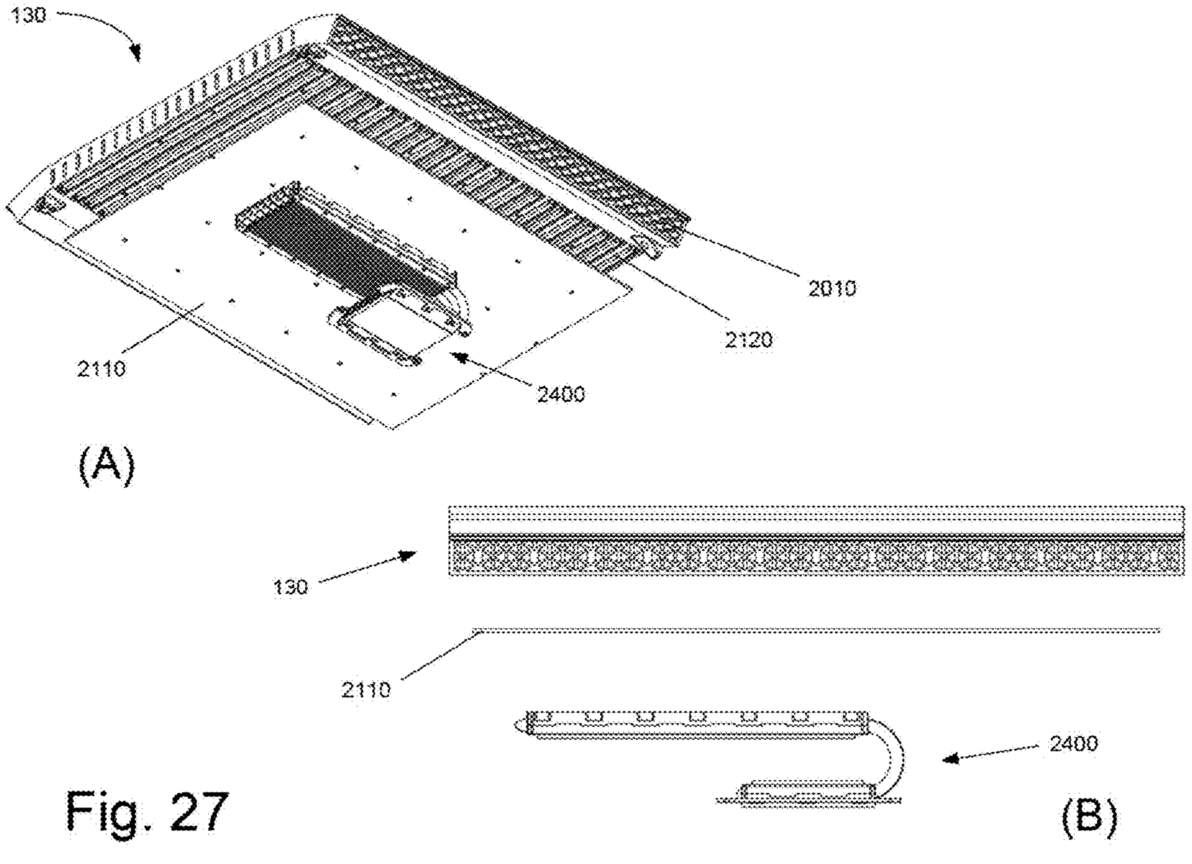
FIG. 27 shows (A) a lower perspective view and (B) a side elevational view of the top hatch, the top interface panel, and the CPU block according to an embodiment.

FIG. 27 shows (A) a lower perspective view and (B) a side elevational view of the top hatch 130, the top interface panel 2110, and the CPU block 2400 according to an embodiment. The top hatch 130 includes integrated heat pipes 2120 to contact the top interface panel 2110. The CPU block 2400 is in contact with the top interface panel 2110. The CPU contacts the CPU block 2400 which transfers thermal energy to the top interface panel 2110. This energy is then spread across the interface panel 2110 to the heat pipes 2120 and onto the top hatch 130 to the exterior. This energy can then be efficiently transferred via any or all of conduction, convection, and radiation outside of the enclosure. These heat transfer processes are used throughout the system enclosure 100 in various fashions, but with the same objectives. They are to directly counteract temperature increases and failure of components creating concentrated thermal energy and at the same time maintain a stable environment of sealed ambient air that does not inhibit the operation of any components contained in the sealed enclosure 100. That is, the stable environment allows for full computational performance of the device in the enclosure 100. While most ruggedized computers will survive tough conditions with limiting performance, the present enclosure 100 provides a stable environment that allows for not just survival but optimal performance.

Figure 28:
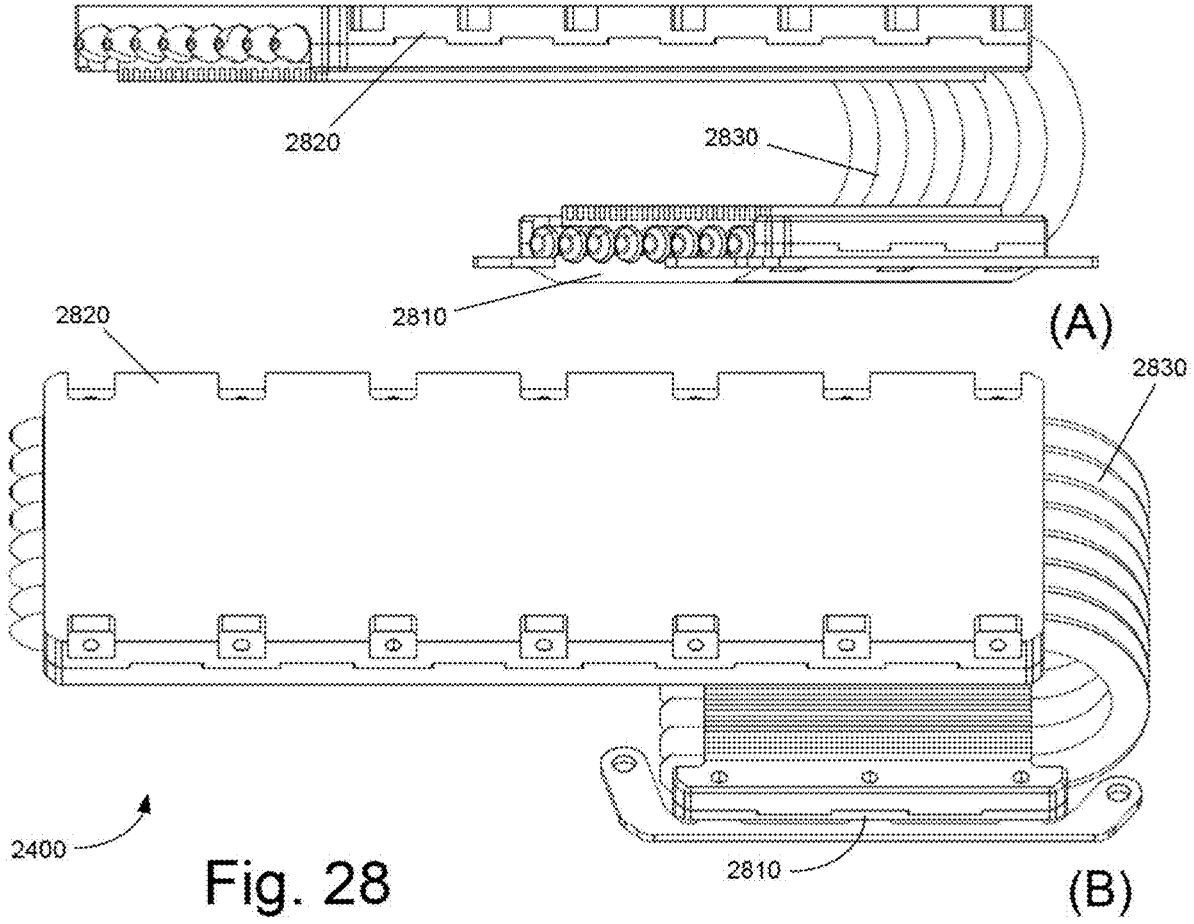
FIG. 28 shows (A) an angled elevational view and (B) an angled top view of a CPU block subassembly according to one embodiment.
Figure 29:
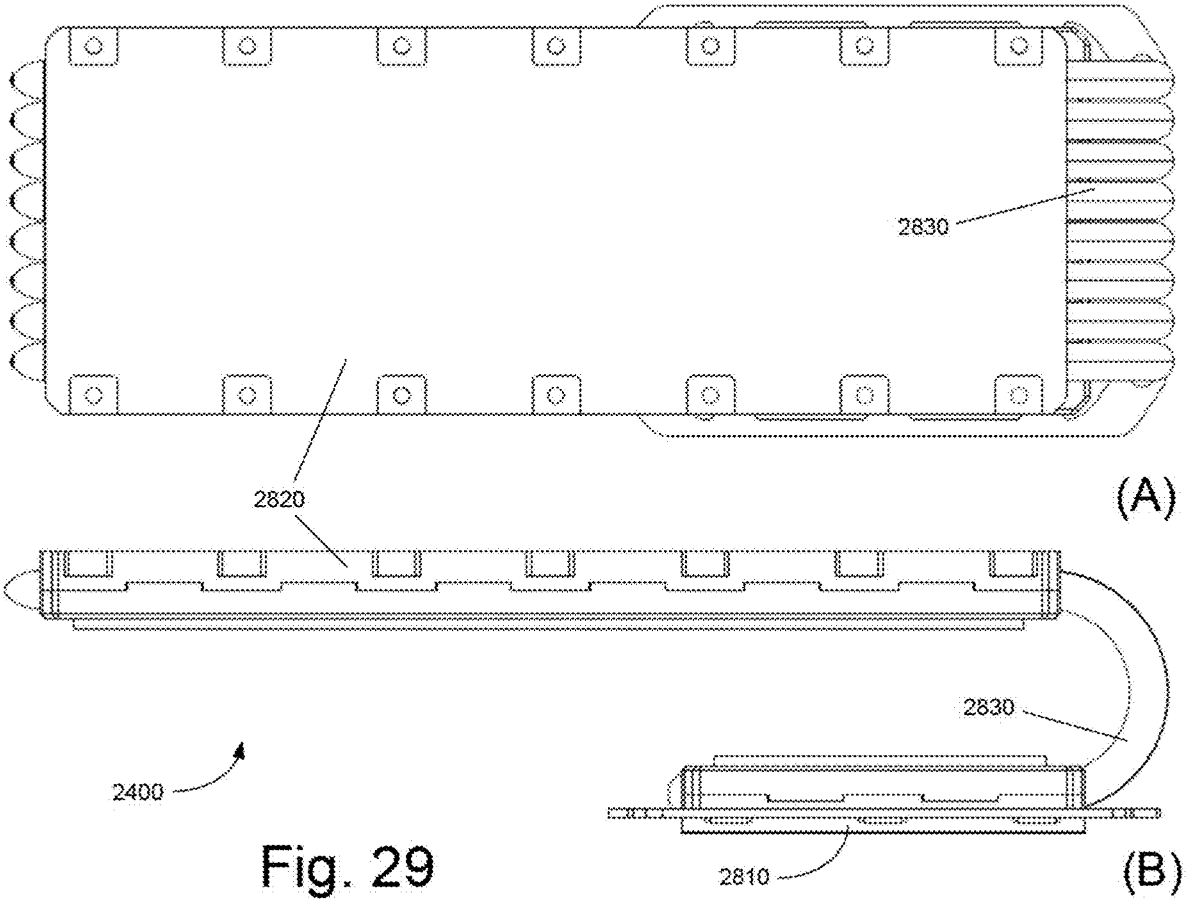
FIG. 29 shows (A) a top plan view and (B) a side elevational view of the CPU block subassembly of FIG. 28.

FIG. 28 shows (A) an angled elevational view and (B) an angled top view of a CPU block subassembly 2400 according to one embodiment. FIG. 29 shows (A) a top plan view and (B) a side elevational view of the CPU block subassembly 2400 of FIG. 28. The CPU block 2400 includes a CPU block contact member 2810 and a heat sink contact member 2820, which are spaced from one another and connected via a plurality of CPU block heat pipes 2830. The CPU block contact member 2810 mounts directly to the motherboard 2500 and makes direct contact with the CPU utilizing a thermal compound (e.g., silicone with metal fillers) or a thermal pad (e.g., made of silicone with metal fillers) to maximize thermal conductivity. The heat sink contact member 2820 mates with the top interface panel 2110, but it is configured to be able to translate in any direction on the top interface panel 2110 so as to change the position of contact with the top interface panel 2110. As such, the CPU block 2400 is adaptable for use with different motherboards having different CPU socket locations. Thus, the different CPU socket locations will not affect how the subassembly of the top hatch 130 and top interface panel 2110 integrates with the motherboard(s).

This CPU block 2400 is custom designed to integrate into the system enclosure 100. The CPU block heat pipes 2830 are secured to the CPU block contact member 2810 on one end and a heat sink contact member 2820 on the other end. Because the system enclosure 100 is sealed, the heat needs to be transferred to the system lattice structure surrounding the components inside the enclosure 100. For the CPU block 2400, the heat pipes 2830 are configured (i.e., bent) in a way that allows a large contact area with the top hatch lattice structure 2000 by compression. The contact surface area between the heat sink contact member 2820 and the top interface panel 2110 is substantially larger than (e.g., at least twice as large) the contact surface area between the CPU block contact member 2810 and the CPU on the PCB or motherboard 2500. If the CPU heat pipes are travelling longitudinally along the lattice, then the heat pipes nestled on the hatch above are mounted latitudinally. The heat pipes 2830 nestled in the top hatch 130 are recessed and sit aligned with the Y branch of the lattice 2000 within.

The CPU block 2400 is a second closed system of one or more second heat pipes 2830 disposed in the enclosure interior and including a second working fluid flowing therein. The second heat pipes 2830 are disposed adjacent to or in contact with the top interface panel 2110. The PCB or motherboard 2500 is disposed in the PCB space which is adjacent to or in contact with the one or more second heat pipes 2830 of the second closed system. The second closed system comprises the CPU block 2400 disposed between the top interface panel 2110 and a location in the PCB space to position a CPU of the PCB 2500. The CPU block 2400 comprises a heat sink contact member 2820 to contact the top interface panel 2110 and the CPU block contact member 2810 to contact the CPU of the PCB 2500. The second heat pipes 2830 extend between the heat sink contact member 2820 and the CPU block contact member 2810. A heat sink contact surface area between the heat sink contact member 2820 and the top interface panel 2110 is substantially larger than a CPU contact surface area between the CPU block contact member 2810 and the CPU.

This design of the CPU block subassembly 2400 may change slightly depending on the exact CPU socket of the motherboard enclosed. For example, the CPU block 2400 may be reduced in size if the thermal requirements are set to a lower threshold. This particular embodiment of the CPU block 2400 can handle the thermal output of any COTS CPU currently available. While the CPU block 2400 required differs between the type of CPU socket on a motherboard 2500, the enclosure 100 as a subassembly is still universal. The CPU block 2400 may be machined from copper which has excellent thermal conductivity.

Figure 30:
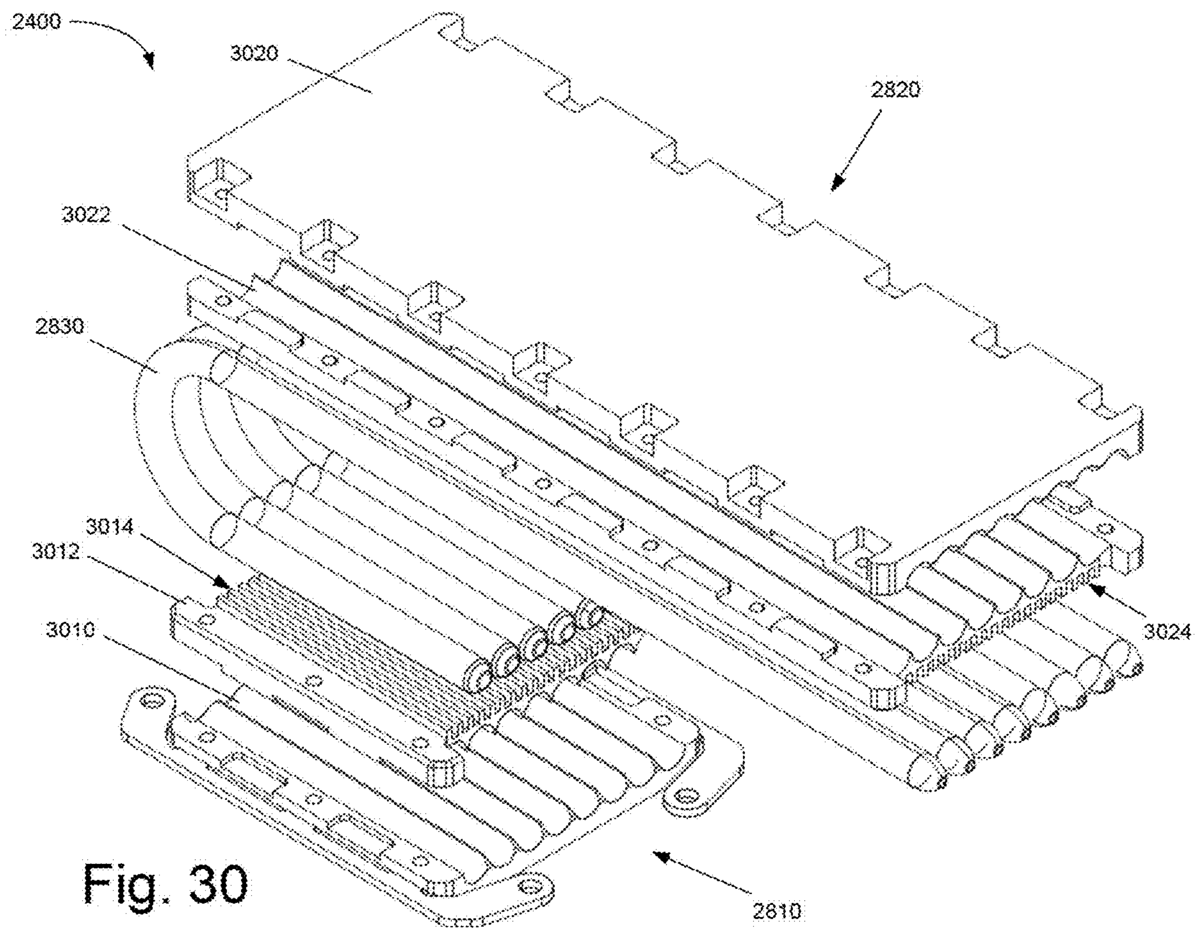
FIG. 30 is an exploded perspective view of the CPU block subassembly of FIG. 28 according to an embodiment.
Figure 31:
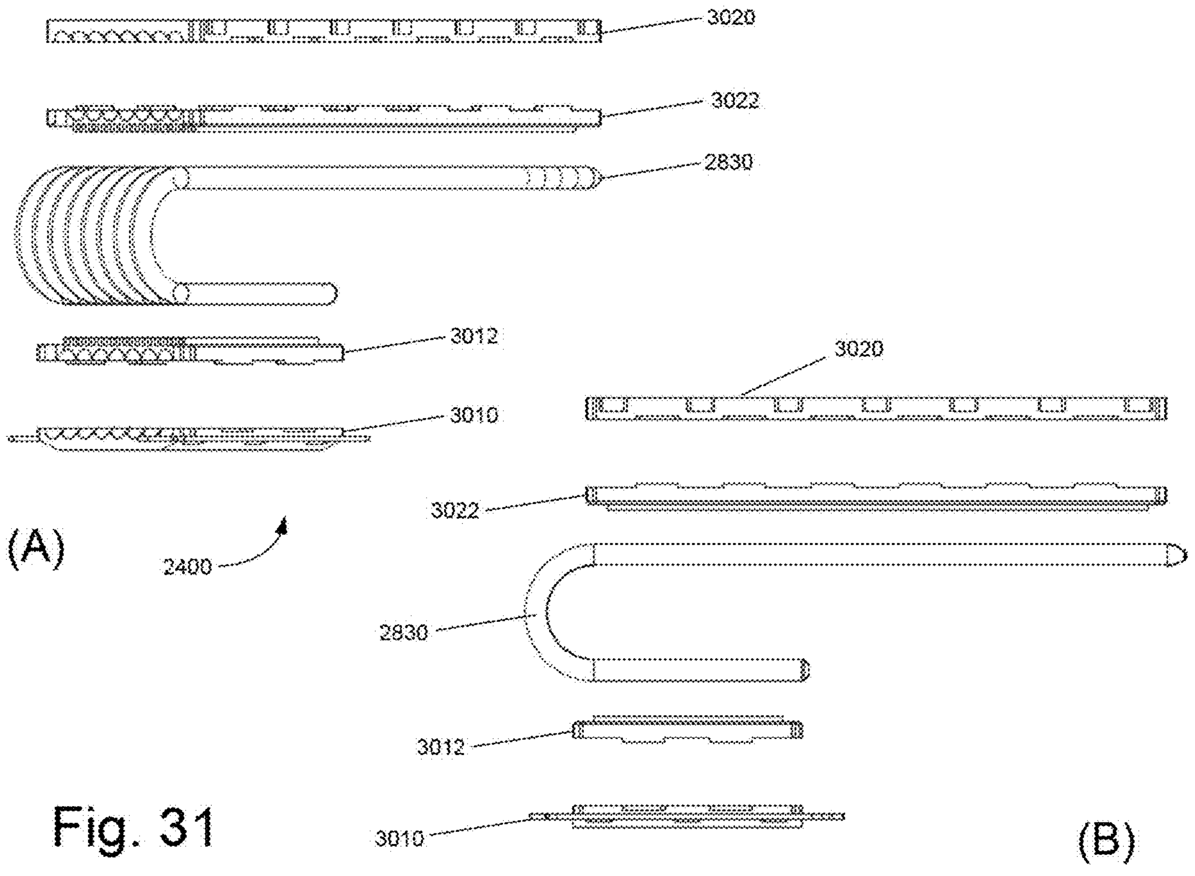
FIG. 31 shows (A) an exploded angled elevational view and (B) an exploded side elevational view of the CPU block subassembly of FIG. 28.

FIG. 30 is an exploded perspective view of the CPU block subassembly 2400 of FIG. 28 according to an embodiment. FIG. 31 shows (A) an exploded angled elevational view and (B) an exploded side elevational view of the CPU block subassembly 2400 of FIG. 28. As illustrated, the CPU block contact member 2810 includes a first contact member or a contact base 3010 and a first block or contact base block 3012 which are connected together (e.g., by fasteners such as bolts) to compress or secure a portion of the heat pipes 2830 therebetween. Similarly, the heat sink contact member 2820 includes a second contact member or a contact top 3020 and a second block or a contact top block 3022 which are connected together (e.g., by fasteners such as bolts) to compress or secure another portion of the heat pipes 2830 therebetween. The components of the CPU block subassembly 2400 are typically made of metal such as copper. The heat pipes 2830 are separated from the copper blocks (3010, 3012, 3020, 3022) in the exploded views of FIGS. 30 and 31 to better illustrate the tab and slot design which ensures correct mating of the copper blocks during subassembly.

In addition, a thermal compound (e.g., silicone with metal fillers) may be utilized between the heat pipes 2830 and the copper blocks (3010, 3012, 3020, 3022) to maximize thermal conductivity and thermal transfer rate. The blocks (3012, 3022) that do not make direct contact with the CPU or interface panel are finned (3014, 3024). The finned blocks (3012, 3022) serve as finned block heat exchangers with increased surface areas for thermal energy radiation. With additional cross flow of ambient air, the rate of convection is also increased by using finned blocks.

Sensors and Controls

Figure 32:
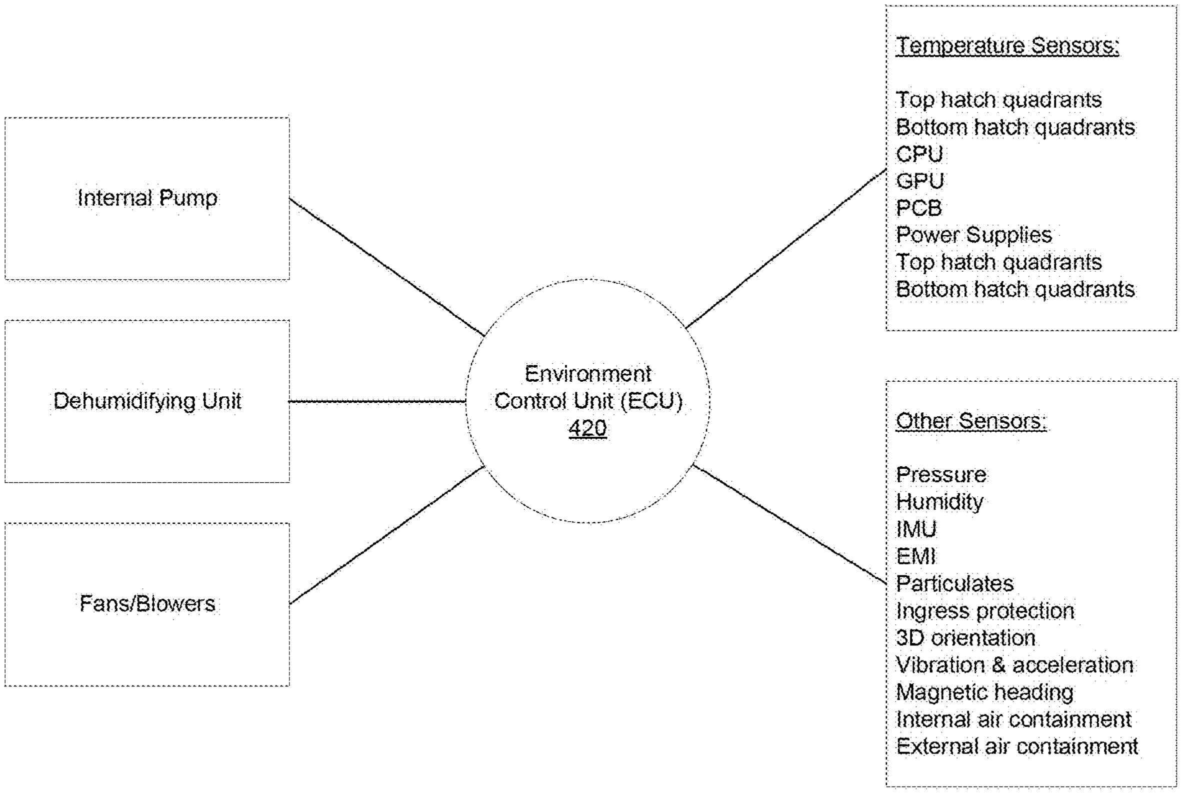
FIG. 32 is a block diagram illustrating an example of a system of sensor and controls.

FIG. 32 is a block diagram illustrating an example of a system of sensor and controls. The system includes a network of integrated sensors to monitor internal and external environmental conditions, including, for example, temperatures, pressure, humidity, IMU (Inertial Measurement Unit), EMI, particulates or ingress protection (to alert if there is an issue with ingress protection or possible particulates created by a component housed inside), 3D orientation, vibration and acceleration, magnetic heading, internal air containment level, and external air containment level.

The environmental control unit (ECU) 420 is coupled to the network of integrated sensors to output controls to the various subsystems and subassemblies that make up the functioning air-to-air heat exchanger within the system enclosure 100. The ECU 420 will function to regulate the ambient humidity and temperature inside of the enclosure. Once the humidity is detected inside the enclosure 100 to reach a certain threshold, the ECU 420 will engage a dehumidifying unit and associated fans/blowers (e.g., impeller fans 1510) to cycle inside air and remove moisture. Once a temperature threshold is reached, the ECU 420 will engage the impeller fans 1510 located on the outside of the enclosure to cycle more air through the system lattice. The fans are speed controlled to draw only the required power to reach a set temperature. The ECU 420 will be able to take temperatures from the ambient air and known hot areas of interest or components. This could include, but is not limited to CPU, motherboard, GPU, and power supply temperatures. Another feature to note is that readings can be taken from quadrants of the top hatch 130 and the bottom hatch 132. This means that if one quadrant is warmer than the other, specific impeller fans 1510 could be engaged to directly cool that quadrant, reducing unnecessary power draw from engaging all six fans 1510 each time a temperature threshold is reached.

The system enclosure 100 is more compact than a standard rack-mount computer case. This is advantageous for integrating into a smaller system or platform.

Gallium Cooling

URASE air has a few additional features that allows for further control in an extended thermal operating envelope during extreme conditions. One of these systems is an actively cooled liquid gallium loop. Taking advantage of the super cooling effect, this system can uniformly liquefy the gallium then passing it through an actively chilled heat exchanger bringing the gallium below its freezing temperature then moving the now chilled gallium through a network of pipes within the air-to-air heat exchanger directly targeting areas of high thermal load.

The enclosure 100 may include a network of tubing manufactured into the structure to transport actively cooled liquid gallium which can be used when the threshold of the thermal operating envelope is neared. This gallium loop acts in a different service than the network of heat pipes in that it is used on-demand in the case that a thermal threshold is met by the device housed inside. The heat pipes are an active system that act continuously but require not additional power to operate. The gallium loop will take advantage of phase change to dissipate energy much like a heat pipe, the difference being that the gallium will be actively cooled by a Peltier device (e.g., 510) which requires additional power to operate. The key here is that gallium has a higher thermal capacity and heat exchange rate. Unlike a water loop, gallium provides the advantage of a super-cooling effect. Once the loop is active, the gallium can be cooled below its freezing point without solidifying. As such, in the case that the heat exchanger becomes saturated and can no longer be cooled enough by the air-to-air heat exchanger, the system can take advantage of the Peltier device to actively cool the gallium loop which will take on the additional thermal load until the threshold is no longer exceeded.

Embodiments of the invention can be manifest in the form of methods and apparatuses for practicing those methods.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An enclosure device for a printed circuit board (PCB), the enclosure device comprising:

an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; and one or more fans configured to drive air via one or more inlets from an enclosure exterior outside of the enclosure wall structure through the internal channels and out of the one or more vents;

the enclosure wall structure configured to block air flowing through the internal channels from entering the enclosure interior and wherein the monolithic heat exchanger comprises an additive manufactured heat exchanger core having a hybrid tubular lattice structure which includes one or more turbulent core portions in which the internal channels are interconnected and shaped to produce cross flow between the internal channels and promote turbulent airflow and one or more directional core portions in which the internal channels are directional to limit or block cross flow between the internal channels and impede turbulent airflow.

2. The enclosure device of claim 1, wherein the monolithic heat exchanger includes a turbulent core portion configured to produce cross flow between the internal channels to promote turbulent airflow through the turbulent core portion.

3. The enclosure device of claim 2, further comprising:

a first closed system of one or more first heat pipes including a first working fluid flowing therein, the one or more first heat pipes being disposed adjacent to or in contact with the turbulent core portion of the monolithic heat exchanger, wherein the monolithic heat exchanger has dimples.

4. The enclosure device of claim 3, wherein the first closed system of one or more first heat pipes is integrally formed as an integrated part of the enclosure wall structure and nestled into the dimples of the monolithic heat exchanger.

5. The enclosure device of claim 3, further comprising:

an interface panel disposed in the enclosure interior and disposed adjacent to or in contact with the one or more first heat pipes of the first closed system.

6. The enclosure device of claim 5, further comprising:

a second closed system of one or more second heat pipes disposed in the enclosure interior and including a second working fluid flowing therein, the one or more second heat pipes being disposed adjacent to or in contact with the interface panel.

7. The enclosure device of claim 6, wherein the PCB space is disposed adjacent to or in contact with the one or more second heat pipes of the second closed system.

8. The enclosure device of claim 7, wherein the second closed system comprises a CPU block disposed between the interface panel and a location in the PCB space to position a CPU of the PCB.

9. The enclosure device of claim 8, wherein the CPU block comprises a heat sink contact member to contact the interface panel and a CPU block contact member to contact the CPU of the PCB, and wherein the one or more second heat pipes extend between the heat sink contact member and the CPU block contact member.

10. The enclosure device of claim 9, wherein a heat sink contact surface area between the heat sink contact member and the interface panel is substantially larger than a CPU contact surface area between the CPU block contact member and the CPU.

11. The enclosure device of claim 2, wherein the monolithic heat exchanger includes a directional core portion configured to limit or block cross flow between the internal channels to impede turbulent airflow and promote laminar airflow through the directional core portion.

12. The enclosure device of claim 1, wherein the enclosure wall structure includes a plurality of enclosure wall structure sections which are assembled together to enclose and seal the enclosure interior and which include a plurality of separate heat exchanger wall structure sections each including therein a separate internal geometry of a separate monolithic heat exchanger section having a separate plurality of internal channels, the separate heat exchanger wall structure sections configured to be combined to form a system heat exchanger of a system heat exchanger core having a plurality of system internal channels through which air driven by the one or more fans flows from the one or more inlets to the one or more vents.

13. The enclosure device of claim 12, wherein each separate monolithic heat exchanger section comprises an additive manufactured body to include a tubular lattice structure with the internal channels.

14. The enclosure device of claim 12, wherein the plurality of enclosure wall structure sections are connected to each other via double mechanical seals, each double mechanical seal including an exterior mechanical seal and an interior mechanical seal.

15. The enclosure device of claim 14, wherein the interior mechanical seal comprises at least one of a protruding lip or a flange protruding from one enclosure wall structure section to make contact with one or more other enclosure wall structure sections.

16. The enclosure device of claim 1, wherein the monolithic heat exchanger comprises an aluminum monolithic heat exchanger core having the internal channels configured geometrically to scatter electromagnetic radiation and provide EMI shielding.

17. The enclosure device of claim 1, further comprising:

a plurality of sensors; and an environmental control unit (ECU) coupled to the one or more fans and the sensors, and configured to regulate humidity and temperature of the enclosure interior.

18. An enclosure device for a printed circuit board (PCB), the enclosure device comprising:

an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents;

one or more fans configured to drive air via one or more inlets from an enclosure exterior outside of the enclosure wall structure through the internal channels and out of the one or more vents;

a first closed system of one or more first heat pipes including a first working fluid flowing therein, the one or more first heat pipes being disposed adjacent to or in contact with a portion of the monolithic heat exchanger; and an interface panel disposed in the enclosure interior and disposed adjacent to or in contact with the one or more first heat pipes of the first closed system.

19. An enclosure device for a printed circuit board (PCB), the enclosure device comprising:

an enclosure wall structure enclosing an enclosure interior which has a PCB space in which to dispose the PCB, the enclosure wall structure including therein an internal geometry of a monolithic heat exchanger core of a monolithic heat exchanger having a plurality of internal channels, the enclosure wall structure including one or more vents; and one or more fans configured to drive air via one or more inlets from an enclosure exterior outside of the enclosure wall structure through the internal channels and out of the one or more vents;

the monolithic heat exchanger including a turbulent core portion configured to produce cross flow between the internal channels to promote turbulent airflow through the turbulent core portion, and the monolithic heat exchanger including a directional core portion configured to limit or block cross flow between the internal channels to impede turbulent airflow and promote laminar airflow through the directional core portion.

* * * * *